US011289466B2

(12) United States Patent
Hoya

(10) Patent No.: US 11,289,466 B2
(45) Date of Patent: Mar. 29, 2022

(54) SEMICONDUCTOR UNIT, SEMICONDUCTOR MODULE, AND SEMICONDUCTOR DEVICE

(71) Applicant: Fuji Electric Co., Ltd., Kanagawa (JP)

(72) Inventor: Masashi Hoya, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 234 days.

(21) Appl. No.: 16/781,801

(22) Filed: Feb. 4, 2020

(65) Prior Publication Data
US 2020/0303362 A1    Sep. 24, 2020

(30) Foreign Application Priority Data

Mar. 19, 2019 (JP) .............................. JP2019-051863

(51) Int. Cl.
*H01L 25/18* (2006.01)
*H01L 25/07* (2006.01)
(Continued)

(52) U.S. Cl.
CPC .......... *H01L 25/18* (2013.01); *H01L 23/3121* (2013.01); *H01L 23/49811* (2013.01);
(Continued)

(58) Field of Classification Search
CPC ............. H01L 23/5385; H01L 23/5386; H01L 25/072; H01L 25/18
See application file for complete search history.

(56) References Cited

U.S. PATENT DOCUMENTS

| 5,956,231 A | 9/1999 | Yamada et al. |
| 2012/0241953 A1 | 9/2012 | Yamada et al. |

(Continued)

FOREIGN PATENT DOCUMENTS

| JP | 2007-236044 A | 9/2007 |
| JP | 2012-119618 A | 6/2012 |

(Continued)

OTHER PUBLICATIONS

Sekino et al., ""HPnC" Large-Capacity SiC Hybrid Module", Fuji Electric Journal 2017, vol. 90, No. 4, p. 228-232 (Mentioned in paragraph Nos. 6 and 8 of the specification and English abstract included as a concise explanation of relevance.).

(Continued)

*Primary Examiner* — Omar F Mojaddedi
(74) *Attorney, Agent, or Firm* — Chen Yoshimura LLP

(57) ABSTRACT

A semiconductor unit includes transistor chips; first main circuit terminals that are electrically connected to first main electrodes of the transistor chips; second main circuit terminals that are electrically connected to second main electrodes of the transistor chips; and a sealing body that has two sides and positioned on opposite sides from one another in one direction and that seals the transistor chip and the first and second main circuit terminals except for a portion of each of the first and second main circuit terminals. Moreover, the first main circuit terminals are respectively arranged in both corners of the one side and in a center of the other side of the two sides of the sealing body, and the second main circuit terminals are respectively arranged in a center of the one side and in both corners of the other side of the sealing body.

20 Claims, 17 Drawing Sheets

(51) Int. Cl.
  *H01L 23/498* (2006.01)
  *H01L 23/538* (2006.01)
  *H01L 23/31* (2006.01)
  *H02M 7/00* (2006.01)
  *H02M 7/537* (2006.01)
  *H02M 1/00* (2006.01)

(52) U.S. Cl.
  CPC ...... *H01L 23/5385* (2013.01); *H01L 23/5386* (2013.01); *H01L 25/072* (2013.01); *H02M 7/003* (2013.01); *H02M 7/537* (2013.01)

(56) References Cited

U.S. PATENT DOCUMENTS

| | | | |
|---|---|---|---|
| 2014/0355219 A1* | 12/2014 | Tada | H01L 24/01 361/729 |
| 2015/0138733 A1 | 5/2015 | Tsuda et al. | |
| 2015/0223339 A1* | 8/2015 | Nakamura | H01L 23/49833 361/705 |
| 2017/0077068 A1* | 3/2017 | Horio | H01L 23/49811 |
| 2017/0263535 A1* | 9/2017 | Nakano | H01L 23/48 |
| 2020/0091140 A1 | 3/2020 | Hoya et al. | |

FOREIGN PATENT DOCUMENTS

| | | |
|---|---|---|
| JP | 2014-236150 A | 12/2014 |
| JP | 2015-207685 A | 11/2015 |
| JP | 2015-213408 A | 11/2015 |
| WO | 2011/083737 A1 | 7/2011 |
| WO | 2014/030254 A1 | 2/2014 |
| WO | 2014/208450 A1 | 12/2014 |

OTHER PUBLICATIONS

U.S. Appl. No. 16/566,579, filed Sep. 10, 2019.

* cited by examiner

SEMICONDUCTOR UNIT, SEMICONDUCTOR MODULE, AND SEMICONDUCTOR DEVICE

BACKGROUND OF THE INVENTION

Technical Field

The present invention relates to a power semiconductor unit as well as to a semiconductor module and a semiconductor device which use a plurality of these semiconductor units.

Background Art

In the field of power semiconductor devices such as inverters that convert DC power to AC power, one-in-one semiconductor units which include a single set of a semiconductor switching device and a rectifier in a single package (hereinafter, "one-in-one semiconductor units") and two-in-one semiconductor modules which include two one-in-one semiconductor units in a single package (hereinafter, "two-in-one semiconductor modules") are used. Patent Document 1 proposes a high current capacity semiconductor device configuration in which a plurality of semiconductor modules are connected in parallel, each including, arranged facing one another, one-in-one semiconductor units having the source terminal, drain terminal, and gate terminal of a semiconductor switching device arranged in a lengthwise direction. A positive terminal busbar which connects the drain terminals and a negative terminal busbar which connects the source terminals are arranged closely in a parallel manner so as to reduce inductance.

Patent Document 2 discloses a semiconductor device in which one-in-one semiconductor units are arranged facing one another and positive terminal and negative terminal busbar principal surfaces are juxtaposed running parallel to a vertical direction. Patent Document 3 discloses arranging flat plate-shaped positive terminal and negative terminal busbars closely in a layered manner parallel to the principal surfaces of a semiconductor device. Patent Document 4 discloses a semiconductor device in which a plurality of one-in-one semiconductor units are arranged closely to one another. Patent Document 5 discloses a semiconductor device in which a plurality of one-in-one semiconductor units, each including a wiring substrate having conductive posts fixed thereto, are integrated together. Patent Document 6 discloses a semiconductor device in which a plurality of two-in-one semiconductor modules, each including a wiring substrate having conductive posts connected thereto, are integrated together. Patent Document 7 discloses a semiconductor device which uses a plurality of two-in-one semiconductor modules in which portions of respective positive terminals and negative terminals are layered parallel to one another on upper portions of semiconductor elements. Patent Document 8 discloses a semiconductor device including two one-in-one semiconductor units, with a first main electrode of one being connected to a second main electrode of the other.

In Patent Documents 1, 2, 3, 6, and 7, busbars which respectively connect positive terminals and negative terminals are arranged parallel to one another so that current flows in opposite directions therethrough, thereby reducing parasitic inductance (floating inductance). In Patent Document 4, semiconductor units are arranged side by side, and current flowing through the semiconductor device of one semiconductor unit and current flowing through the semiconductor device of the next semiconductor unit are made to flow in opposite directions so as to reduce parasitic inductance. In high-power semiconductor modules and semiconductor devices, a plurality of semiconductor units are used connected together in parallel. Also, in the semiconductor units themselves, a plurality of main circuit chips can be used connected together in parallel for higher-power use cases. Patent Documents 1 to 8 do not discuss reducing parasitic inductance in one-in-one semiconductor units in which a plurality of main circuit chips are connected together in some arrangement.

Two-in-one semiconductor modules which function as half-wave rectifier (half-bridge) circuits include a positive-side one-in-one semiconductor unit (upper arm) and a negative-side one-in-one semiconductor unit (lower arm). A node between the upper arm and lower arm serves as an output connector and is connected to an output terminal. Due to the inductance between the DC terminals of the two-in-one semiconductor module, surge voltages and the like can occur during switching operation. Such events tend to have negative effects, and therefore there is a need to reduce parasitic inductance between DC terminals. In the two-in-one semiconductor module, the DC current path includes a positive terminal, a positive connector, the upper arm, the output connector, the lower arm, a negative connector, and a negative terminal. The sum of the inductances of each component on this current path becomes the inductance between the DC terminals of the two-in-one semiconductor module. Therefore, reducing the parasitic inductance of the overall two-in-one semiconductor module requires reducing the parasitic inductance of each component on this current path.

Thus, the present inventors investigated whether it was possible to achieve a reduction in parasitic inductance by changing the arrangement direction of semiconductor units. As a result of this investigation, it was found that in an existing semiconductor unit, first main circuit terminals were arranged on one side of two sides facing one another, and second main circuit terminals were arranged on the other side, which resulted in low ease of use, particularly when using two semiconductor units to construct a half-wave rectifier circuit.

Furthermore, Non-Patent Document 1 discloses a power semiconductor device in which two-in-one semiconductor modules that function as half-wave rectifier circuits are arranged in parallel to achieve greater current capacity.

In addition, Patent Document 8 discloses a semiconductor device in which semiconductor modules having two electrodes with the same function respectively arranged on two sides positioned on opposite sides of a case from one another are connected in series.

RELATED ART DOCUMENTS

Patent Documents

Patent Document 1: Japanese Patent Application Laid-Open Publication No. 2014-236150
Patent Document 2: Japanese Patent Application Laid-Open Publication No. 2007-236044
Patent Document 3: WO 2014/208450
Patent Document 4: Japanese Patent Application Laid-Open Publication No. 2015-207685
Patent Document 5: WO 2011/083737
Patent Document 6: Japanese Patent Application Laid-Open Publication No. 2012-119618

Patent Document 7: Japanese Patent Application Laid-Open Publication No. 2015-213408
Patent Document 8: WO 2014/030254

Non-Patent Documents

Non-Patent Document 1: Fuji Electric Journal 2017 Vol. 90 No. 4. "HPnC" Large-Capacity SiC Hybrid Module. p. 228-232

SUMMARY OF THE INVENTION

In light of the problems described above, the present invention aims to provide a semiconductor unit which offers high ease of use, as well as a semiconductor module and a semiconductor device which include this semiconductor unit.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor unit, comprising: one or plurality of transistor chips each having a first main electrode and a second main electrode; first main circuit terminals that are electrically connected to the first main electrode of each of said one or plurality of the transistor chips; second main circuit terminals that are electrically connected to the second main electrode of each of said one or plurality of the transistor chips; and a sealing body having a generally rectangular shape with two sides respectively defining two sides of the semiconductor unit opposing to each other in a first direction in a plan view, the sealing body sealing said one or plurality of the transistor chips and the first and second main circuit terminals except for respective distal portions of the first and second main circuit terminals that are exposed from the sealing body, wherein the first main circuit terminals are arranged in both corners of one side, among said two sides, of the semiconductor unit, and in a center of another side, among said two sides, of the semiconductor unit in the plan view, and wherein the second main circuit terminals are arranged in a center of said one side of the semiconductor unit and in both corners of said another side of the semiconductor unit in the plan view.

In another aspect, the present disclosure provides a semiconductor module, comprising: two of the above-described semiconductor unit as an upper arm semiconductor unit for an upper arm of a half-bridge circuit and a lower arm semiconductor unit for a lower arm of the half-bridge circuit, the upper and lower semiconductor units being arranged side-by-side with said one side of the upper arm semiconductor unit and said another side of the lower semiconductor unit facing each other; a positive external terminal having a positive connector extending from the positive external terminal, an end of the positive connector being directly connected to the first main circuit terminals arranged in said both corners of said one side of the upper arm semiconductor unit and being not directly connected to the first main circuit terminals arranged in said center of said another side of the upper arm semiconductor unit; a negative external terminal having a negative connector extending from the negative external terminal, an end of the negative connector being directly connected to the second main circuit terminals arranged in said both corners of said another side of the lower arm semiconductor unit, and being not directly connected to the second main circuit terminals arranged in said center of said one side of the lower arm semiconductor unit; an output external terminal having an output connector extending from the output external terminal, an end of the output connector being directly connected to either the first main circuit terminals arranged in said both corners of said one side of the lower arm semiconductor unit, or the second main circuit terminals arranged in said both corners of said another side of the upper arm semiconductor unit; and an intermediate connector that is connected to the second main circuit terminals arranged in said center of said one side of the upper arm semiconductor unit and to the first main circuit terminals arranged in said center of said another side of the lower arm semiconductor unit.

In another aspect, the present disclosure provides a semiconductor module, comprising: two of the above-described semiconductor unit as an upper arm semiconductor unit for an upper arm of a half-bridge circuit and a lower arm semiconductor unit for a lower arm of the half-bridge circuit, the upper and lower arm semiconductor units being arranged side-by-side with said one side of the upper arm semiconductor unit and said one side of the lower arm semiconductor unit facing each other; a positive external terminal having a positive connector extending from the positive external terminal, an end of the positive connector being directly connected to the first main circuit terminals arranged in said both corners of said one side of the upper arm semiconductor unit and being not directly connected to the first main circuit terminals arranged in said center of said another side of the upper arm semiconductor unit; a negative external terminal having a negative connector extending from the negative external terminal, an end of the negative connector being directly connected to the second main circuit terminals arranged in said center of said one side of the lower arm semiconductor unit, and being not directly connected to the second main circuit terminals arranged in said both corners of said another side of the lower arm semiconductor unit; an output external terminal having an output connector extending from the output external terminal, an end of the output connector being directly connected to the first main circuit terminals arranged in said center of said another side of the lower arm semiconductor unit; and an intermediate connector that is connected to the second main circuit terminals arranged in said center of said one side of the upper arm semiconductor unit and to the first main circuit terminals arranged in said both corners of said one side of the lower arm semiconductor unit.

In another aspect, the present disclosure provides a semiconductor module, comprising: two of the above-described semiconductor unit as an upper arm semiconductor unit for an upper arm of a half-bridge circuit and a lower arm semiconductor unit for a lower arm of the half-bridge circuit, the upper and lower arm semiconductor units being arranged side-by-side with said another side of the upper arm semiconductor unit and said another side of the lower arm semiconductor unit facing each other; a positive external terminal having a positive connector extending from the positive external terminal, an end of the positive connector being directly connected to the first main circuit terminals arranged in said center of said another side of the upper arm semiconductor unit and being not directly connected to the first main circuit terminals arranged in said both corners of said one side of the upper arm semiconductor unit; a negative external terminal having a negative connector extending from the negative external terminal, an end of the negative connector being directly connected to the second main circuit terminals arranged in said both corners of said another side of the lower arm semiconductor unit, and being not directly connected to the second main circuit terminals arranged in said center of said one side of the lower arm semiconductor unit; an output external terminal having an output connector extending from the output external terminal, an end of the output connector being directly connected to the second main circuit terminals arranged in said center of said one side of the upper arm semiconductor unit; and an intermediate connector that is connected to the second main circuit terminals arranged in said both corners of said another side of the upper arm semiconductor unit and to the first main circuit terminals arranged in said center of said another side of the lower arm semiconductor unit.

In another aspect, the present disclosure provides a semiconductor device comprising: one of the above-described semiconductor modules as a first semiconductor module; and another of the above-described semiconductor modules as a second semiconductor module, wherein the first semiconductor module and the second semiconductor module are arranged side-by-side with each other with the upper arm semiconductor unit of the first semiconductor module and the lower arm semiconductor unit of the second semiconductor module being arranged side-by-side and adjacent to each other and with the lower arm semiconductor unit of the first semiconductor module and the upper arm semiconductor unit of the second semiconductor module being arranged side-by-side and adjacent to each other.

The present invention makes it possible to provide a semiconductor unit which offers high ease of use, as well as a semiconductor module and a semiconductor device which include this semiconductor unit. It is to be understood that both the foregoing general description and the following detailed description are exemplary and explanatory, and are intended to provide further explanation of the invention as claimed.

DETAILED DESCRIPTION OF EMBODIMENTS

Figure 1:
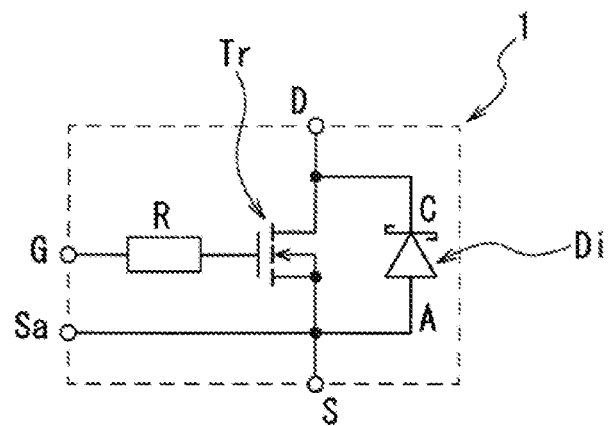
FIG. 1 is an equivalent circuit diagram illustrating an example of a semiconductor unit according to Embodiment 1 of the present invention.

Next, Embodiments 1 and 2 of the present invention will be described with reference to figures. In the following descriptions of the figures, the same or similar reference characters will be used for components that are the same or similar, and redundant descriptions will be omitted. However, the figures are only intended to be schematic illustrations, and the relationships between thickness and planar dimensions, the proportions between the thicknesses of each layer, and the like may be different from in the actual devices. Similarly, the illustrated dimensional relationships and proportions of components in the figures may differ from one figure to the next. Moreover, the embodiments described below are only examples of devices or methods for implementing the technical concepts of the present invention, and the technical concepts of the present invention do not limit the component part materials, shapes, structures, arrangements, or the like to those presented below.

In the present specification, the terms "first main electrode" and "third main electrode" of a semiconductor device, which constitutes a transistor chip, refer, in a field-effect transistor (FET) or a static induction transistor (SIT), to one of the source electrode and the drain electrode. In an insulated-gate bipolar transistor (IGBT), these terms refer to one of the emitter electrode and the collector electrode. Moreover, in a static induction thyristor (SI thyristor) or gate turn-off thyristor (GTO), these terms refer to one of the anode electrode and the cathode electrode. The terms "second main electrode" and "fourth main electrode" of a semiconductor device, which constitutes a transistor chip, refer, in a FET or a SIT, to another of the source and the drain electrodes. In an IGBT, these terms refer to another of emitter and collector electrodes. In an SI thyristor or GTO, these terms refer to another of the anode and cathode electrodes. Thus, if the first main electrode and third main electrode are the source electrodes, the second main electrode and fourth main electrode would be the drain electrodes. If the first main electrode and third main electrode are the emitter electrodes, the second main electrode and fourth main electrode would be the collector electrodes. If the first main electrode and third main electrode are the anode electrodes, the second main electrode and fourth main electrode would be the cathode electrodes. If the bias relationships are interchanged, in many cases the function of the first main electrode and third main electrode and the function of the second main electrode and fourth main electrode are interchangeable.

In the present specification, the source electrode of a MIS transistor is "one main electrode (first or third main electrode)" which can be selected as the emitter electrode of an insulated-gate bipolar transistor (IGBT). Moreover, in a thyristor such as a MIS-controlled static induction thyristor (SI thyristor), the one main electrode can be selected as the cathode electrode. The drain electrode of a MIS transistor is "another main electrode (second or fourth main electrode)" of a semiconductor chip/device which can be selected as the collector electrode of an IGBT or as the anode electrode of a thyristor.

Embodiment 1

<Semiconductor Unit>

First, a semiconductor unit according to Embodiment 1 of the present invention will be described. In Embodiment 1, a first main electrode of a transistor chip will be described as being a drain electrode, and a second main electrode will be described as being a source electrode.

As illustrated in FIG. 1, a semiconductor unit 1 according to Embodiment 1 of the present invention includes a switching device Tr and a rectifier Di which is reverse-connected to this switching device Tr. The cathode electrode C of the rectifier Di is electrically connected to a drain electrode (first main electrode) D of the switching device Tr. The drain electrode D is electrically connected to first main circuit terminals 7a (see FIG. 2), which will be described later. The anode electrode A of the rectifier Di is electrically connected to a source electrode (second main electrode) S of the switching device Tr. A resistor R (impedance regulator) for regulating switching speed or loss is connected to a control electrode (gate electrode) G of the switching device Tr. The control electrode G is electrically connected to control terminals 7c (see FIG. 2), which will be described later. An auxiliary source electrode Sa is an auxiliary electrode for detecting voltage or the like on the source electrode S side and is electrically connected to auxiliary terminals 7d (see FIG. 2), which will be described later.

Figure 3:
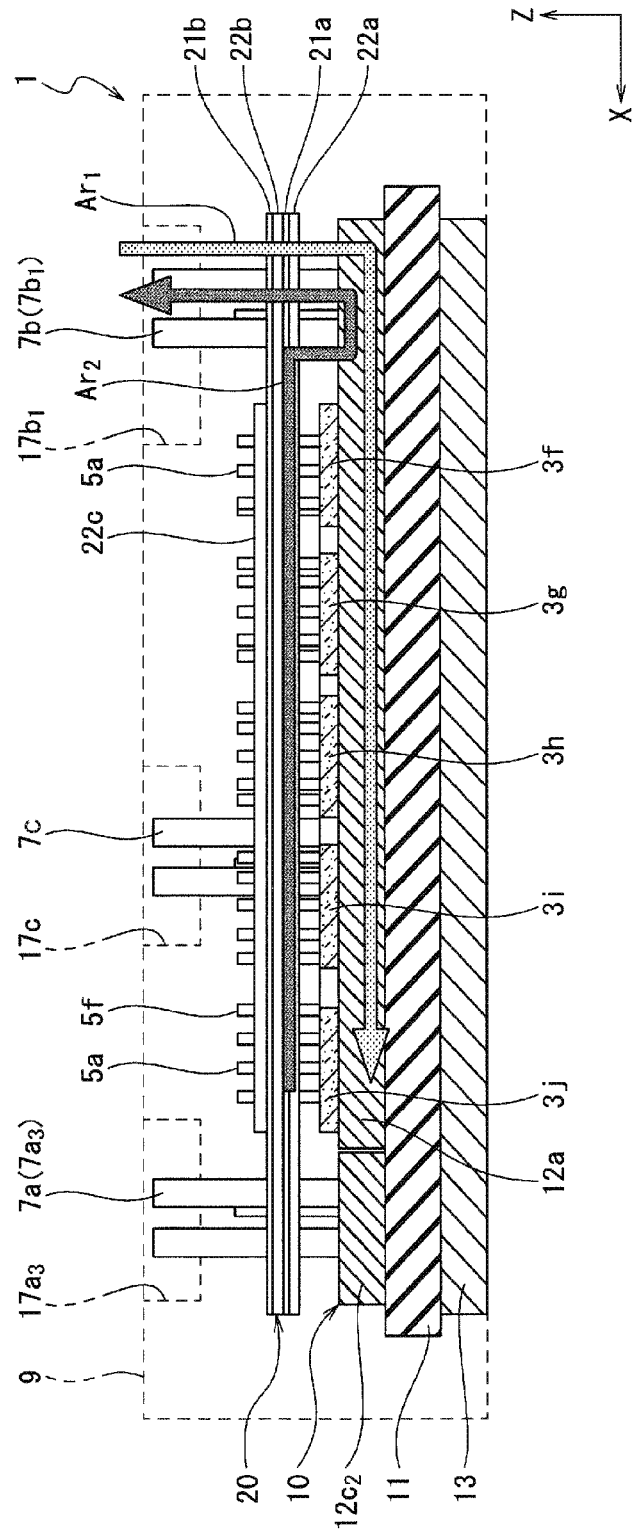
FIG. 3 is a cross-sectional view schematically illustrating a cross-sectional structure taken at the position of cutline II-II in FIG. 2.
Figure 4:
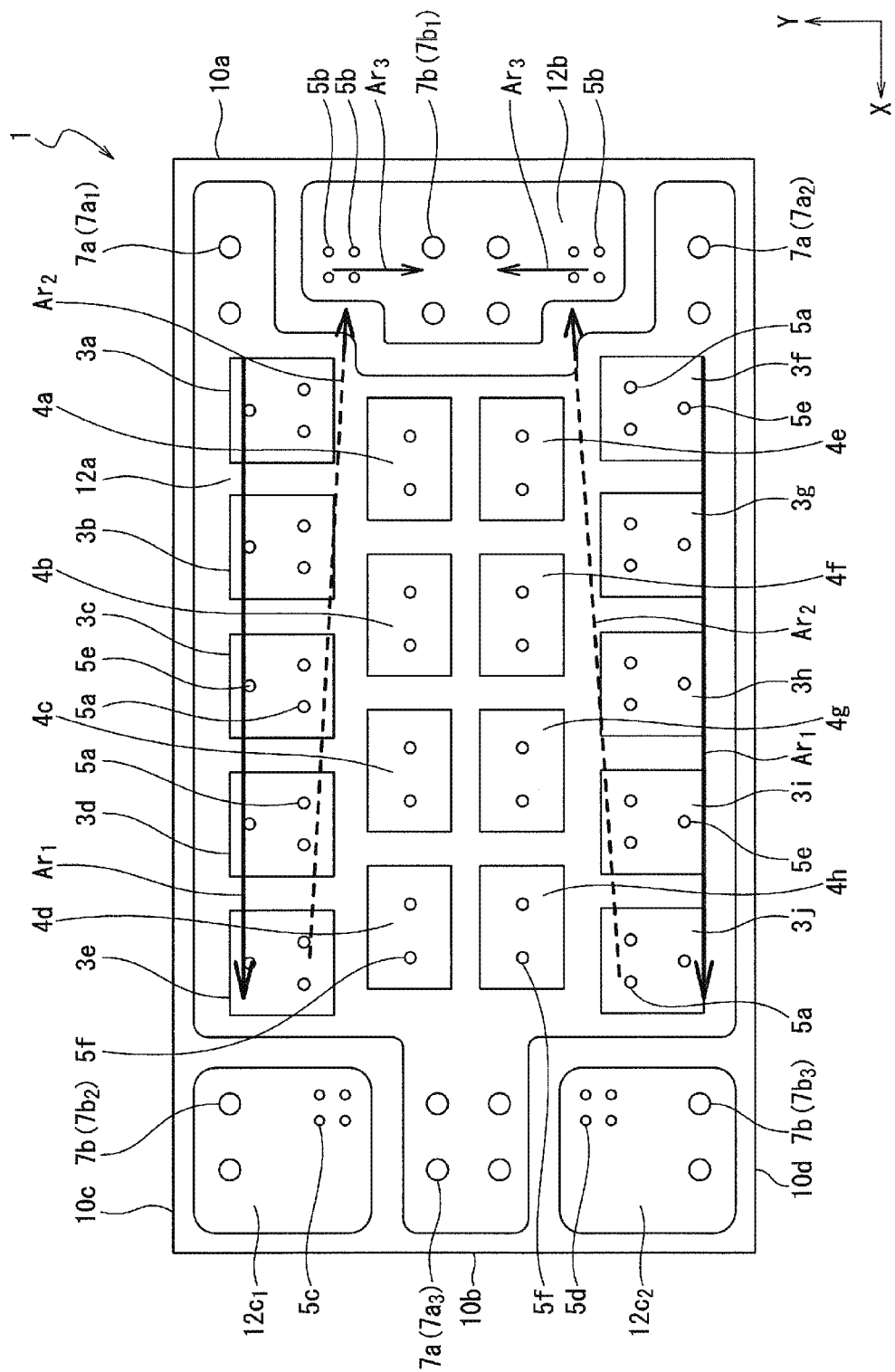
FIG. 4 is a plan view schematically illustrating an example of chip arrangement in the semiconductor unit according to Embodiment 1 of the present invention.

The switching device Tr has a configuration in which a plurality of transistor chips 3a to 3j illustrated in FIGS. 3 and 4 are connected in parallel. Moreover, the rectifier Di has a similar configuration in which a plurality of diode chips 4a to 4h illustrated in FIGS. 3 and 4 are connected in parallel. It is preferable that vertical semiconductor devices having an insulated-gate structure in which primary current flows in the depth direction of the transistor chip, such as MIS transistors or IGBTs, be used for the switching device Tr. It is preferable that vertical semiconductor devices such as fast recovery diodes (FRDs) or Schottky barrier diodes (SBDs) be used for the rectifier Di. Below, the switching device Tr will be described as being vertical insulated-gate silicon carbide (SiC) MISFETs, and the rectifier Di will be described as being SiC SBDs.

Here, the concept of MIS transistors that constitute the transistor chips includes MISFETs, MISSITs, and the like. In contrast to a MOS transistor, in which a silicon oxide ($SiO_2$) film is used for the gate insulating film, "MIS transistor" is a more encompassing term referring to an insulated-gate transistor in which an insulating film other than an $SiO_2$ film can be used for the gate insulating film. In a MIS transistor, a silicon oxynitride (SiON) film, strontium oxide (SrO) film, silicon nitride ($Si_3N_4$) film, or aluminum oxide ($Al_2O_3$) film can be used for the gate insulating film. Alternatively, a magnesium oxide (MgO) film, yttrium oxide ($Y_2O_3$) film, hafnium oxide ($HfO_2$) film, zirconium oxide (ZrO2) film, tantalum oxide ($Ta_2O_5$) film, or bismuth oxide ($Bi_2O_3$) film may be used. Moreover, a composite film or the like in which several of these single-layer films are selected and layered together in plurality can be used. Furthermore, semiconductor materials other than SiC such as silicon (Si), gallium nitride (GaN), diamond, and aluminum nitride (AlN) can respectively be used as the semiconductor material.

Figure 2:
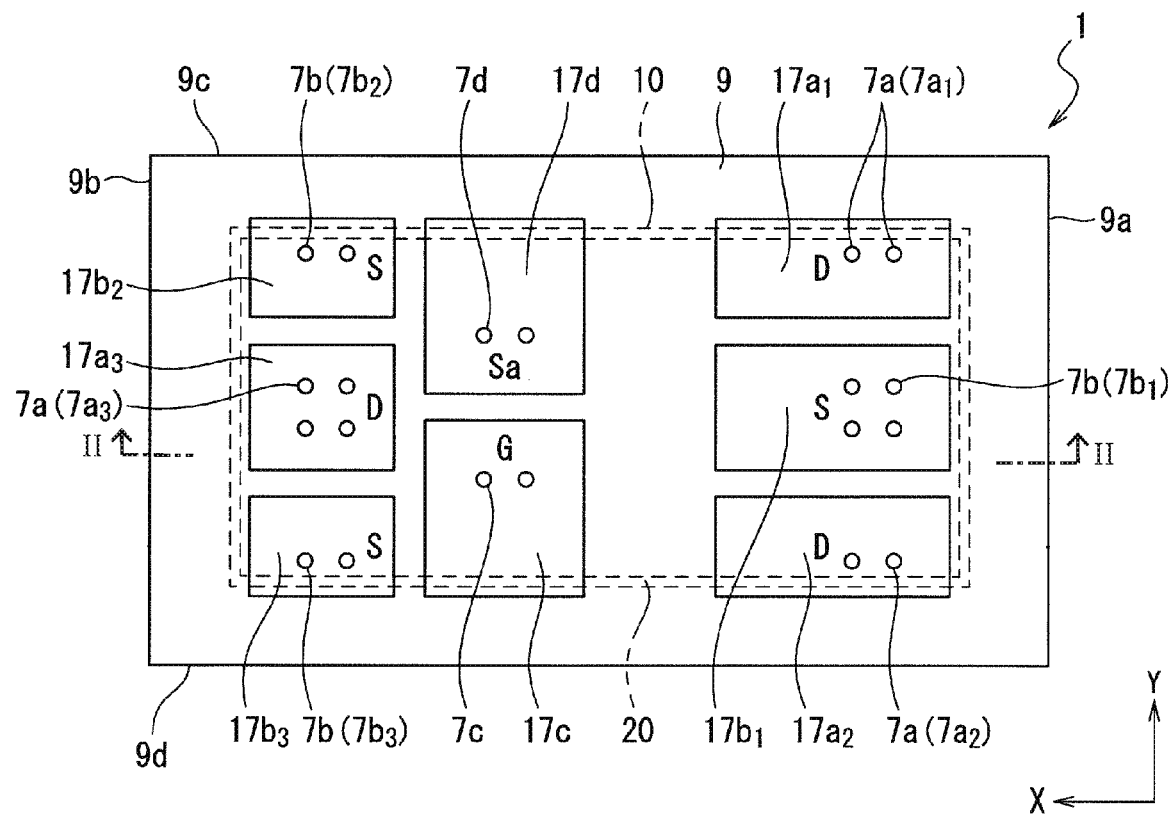
FIG. 2 is a plan view schematically illustrating the example of the semiconductor unit according to Embodiment 1 of the present invention.

As illustrated in FIGS. 2, 3, and 4, the semiconductor unit 1 according to Embodiment 1 of the present invention further includes the plurality of transistor chips 3a to 3j, the plurality of diode chips 4a to 4h, and a plurality of first to sixth conductive posts 5a to 5f. Moreover, the semiconductor unit 1 includes a plurality of first main circuit terminals 7a, a plurality of second main circuit terminals 7b, a plurality of control terminals 7c, a plurality of auxiliary terminals 7d, an insulated circuit board 10, and a wiring substrate 20. Furthermore, the semiconductor unit 1 includes a resin sealing body 9 as a sealing body that seals the plurality of transistor chips 3a to 3j, the plurality of diode chips 4a to 4h, the plurality of conductive posts 5a to 5f, the plurality of first main circuit terminals 7a, the plurality of second main circuit terminals 7b, the plurality of control terminals 7c, the plurality of auxiliary terminals 7d, the insulated circuit board 10, and the wiring substrate 20.

Each of the plurality of transistor chips 3a, 3b, 3c, 3d, 3e, 3f, 3g, 3h, 3i and 3j has a drain electrode (D) (first main electrode) on one surface among two surfaces positioned on opposite sides from one another and has a source electrode (S) (second main electrode) as well as a control electrode (G) on the other surface, for example. Moreover, the plurality of transistor chips 3a to 3j are connected in parallel to form the switching device Tr illustrated in FIG. 2. Each of the plurality of diode chips 4a, 4b, 4c, 4d, 4e, 4f, 4g and 4h has a cathode electrode (C) on one surface among two surfaces positioned on opposite sides from one another and has an anode electrode (A) on the other surface. Furthermore, the plurality of diode chips 4a to 4h are connected in parallel to form the rectifier Di illustrated in FIG. 2.

Each of the first main circuit terminals 7a, the second main circuit terminals 7b, the control terminals 7c, and the auxiliary terminals 7d is constituted by a conductive pin and is sealed by the resin sealing body 9 except for a portion, and that portion protrudes to outside of the resin sealing body 9. In other words, each of the first main circuit terminals 7a, the second main circuit terminals 7b, the control terminals 7c, and the auxiliary terminals 7d extends spanning both inside and outside of the resin sealing body 9.

As illustrated in FIG. 2, the resin sealing body 9 has a quadrate shape such as a rectangular shape when viewed in a plan view, and has one side 9a and another side 9b positioned on opposite sides from one another in a lengthwise direction (one direction; X direction) as well as one side 9c and another side 9d positioned on opposite sides from one another in a widthwise direction (other direction orthogonal to the one direction; Y direction). The side 9a and the side 9b form short sides extending in the widthwise direction of the resin sealing body 9, and the side 9c and the side 9d form long sides extending in the lengthwise direction of the resin sealing body 9. Accordingly, both here in Embodiment 1 as well as below in Embodiment 2, for convenience the side 9a and the side 9b will be referred to as "short sides" while the side 9c and the side 9d will be referred to as "long sides".

On the primary surface (upper surface) of the resin sealing body 9, near the one short side 9a side of the resin sealing body 9, rectangular recesses $17a_1$, $17b_1$, and $17a_2$ are formed in that order going from the one long side 9c towards the other long side 9d of the resin sealing body 9. Moreover, on the primary surface of the resin sealing body 9, near the other short side 9b side of the resin sealing body 9, rectangular recesses $17b_2$, $17a_3$, and $17b_3$ are formed in that order going from the one long side 9c towards the other long side 9d of the resin sealing body 9. Furthermore, on the primary surface of the resin sealing body 9, between the column formed by the recesses $17a_1$, $17b_1$, and $17a_2$ and the column formed by the recesses $17b_2$, $17a_3$, and $17b_3$, rectangular recesses 17d and 17c are formed in that order going from the one long side 9c towards the other long side 9d of the resin sealing body 9.

As illustrated in FIG. 2, the plurality of first main circuit terminals 7a are respectively arranged near both corners of the one short side 9a and near the center of the other short side 9b of the resin sealing body 9. Moreover, although this will be described in more detail later, the plurality of first main circuit terminals 7a are electrically connected to the drain electrodes (D) of the plurality of transistor chips 3a to 3j and to the cathode electrodes (C) of the plurality of diode chips 4a to 7h. Furthermore, the plurality of second main circuit terminals 7b are respectively arranged near the center of the one short side 9a and near both corners of the other short side 9b of the resin sealing body 9. In addition, although this will be described in more detail later, the plurality of second main circuit terminals 7b are electrically connected to the source electrodes (S) of the plurality of transistor chips 3a to 3j and to the anode electrodes (A) of the plurality of diode chips 4a to 7h. In other words, the semiconductor unit 1 according to Embodiment 1 includes, on the one short side 9a side of the resin sealing body 9, a first terminal array (D-S-D) in which the first main circuit terminals $7a_1$ (D), the second main circuit terminals $7b_1$ (S), and the first main circuit terminals $7a_2$ (D) are arranged in that order along that one short side 9a. Moreover, the semiconductor unit 1 according to Embodiment 1 includes, on the other short side 9b side of the resin sealing body 9, a second terminal array (S-D-S) in which the second main circuit terminals $7b_2$ (S), the first main circuit terminals $7a_3$ (D), and the second main circuit terminals $7b_3$ (S) are arranged in that order along that other short side 9b.

The plurality of control terminals 7c and the plurality of auxiliary terminals 7d are arranged in the area of the resin sealing body 9 between the first terminal array (D-S-D) and the second terminal array (S-D-S). Moreover, although this will be described in more detail later, the plurality of control terminals 7c are electrically connected to the control electrodes (G) of the plurality of transistor chips 3a to 3j. Furthermore, although this will be described in more detail later, the plurality of auxiliary terminals 7d are electrically connected to the source electrodes (S) of the plurality of transistor chips 3a to 3j and to the anode electrodes (A) of the plurality of diode chips 4a to 7h.

As illustrated in FIGS. 2 and 3, the first main circuit terminals $7a_1$ are arranged near one corner of the one short side 9a of the resin sealing body 9 and protrude out on one end side from the bottom of the recess $17a_1$ in the resin sealing body 9. The first main circuit terminals $7a_2$ are arranged near the other corner of the one short side 9a of the resin sealing body 9 and protrude out on one end side from the bottom of the recess $17a_2$ in the resin sealing body 9. The first main circuit terminals $7a_3$ are arranged near the center of the other short side 9b of the resin sealing body 9 and protrude out on one end side from the bottom of the recess $17a_3$ in the resin sealing body 9.

The second main circuit terminals $7b_1$ are arranged near the center of the one short side 9a of the resin sealing body 9 and protrude out on one end side from the bottom of the recess $17b_1$ in the resin sealing body 9. The second main circuit terminals $7b_2$ are arranged near one corner of the other short side 9b of the resin sealing body 9 and protrude out on one end side from the bottom of the recess $17b_2$ in the resin sealing body 9. The second main circuit terminals $7b_3$ are arranged near the other corner of the other short side 9b of the resin sealing body 9 and protrude out on one end side from the bottom of the recess $17b_3$ in the resin sealing body 9.

The control terminals 7c protrude out on one end side from the bottom of the recess 17c in the resin sealing body 9. The auxiliary terminals 7d protrude out on one end side from the bottom of the recess 17d in the resin sealing body 9.

As illustrated in FIGS. 3 and 4, the insulated circuit board 10 includes an insulating board 11; a first conductor layer 12a, a second conductor layer 12b, and third conductor layers $12c_1$ and $12c_2$ formed individually separated on the upper surface of the insulating board 11; and a fourth conductor layer 13 formed on the bottom surface of the insulating board 11. A direct-bonded copper (DBC) substrate in which copper is eutectically bonded to the surface of a ceramic substrate, an active metal brazing (AMB) substrate in which metal is arranged on the surface of a ceramic substrate using an AMB process, or the like can be used for the insulated circuit board 10, for example. Examples of materials that can be used for the ceramic substrate include silicon nitride ($Si_3N_4$), aluminum nitride (AlN), alumina ($Al_2O_3$), and the like.

The insulated circuit board 10 has a quadrate shape such as a rectangular shape when viewed in a plan view and has four sides 10a to 10d corresponding to the four sides 9a to 9d of the resin sealing body 9. The first conductor layer 12a has four sides corresponding to the four sides 10a to 10d of the insulated circuit board 10. Furthermore, the first conductor layer 12a has a planar pattern in which both corner portions on one side that is on the same side as the one short side $9a$ of the resin sealing body 9 as well as a center portion on the other side that is on the same side as the other short side $9b$ of the resin sealing body 9 protrude outwards in the lengthwise direction of the resin sealing body 9 (X direction). The second conductor layer $12b$ is arranged between the protruding corner portions on the one side of the first conductor layer $12a$ and has a rectangular shape when viewed in a plan view. The third conductor layers $12c_1$ and $12c_2$ are arranged on both sides of the protruding center portion on the other side of the first conductor layer $12a$ so as to be on either side of that center portion and have a substantially square shape, for example, when viewed in a plan view. The fourth conductor layer 13 is formed as a large-area planar pattern spanning across the insulating board 11 and protrudes out from the rear surface on the side opposite to the primary surface of the resin sealing body 9.

The drain electrode (D) of each of the plurality of transistor chips $3a$ to $3j$ is electrically and mechanically connected to the first conductor layer $12a$. Moreover, the cathode electrode (C) of each of the plurality of diode chips $4a$ to $4h$ is electrically and mechanically connected to the first conductor layer $12a$.

As illustrated in FIG. 3, the wiring substrate 20 is arranged on the plurality of transistor chips $3a$ to $3j$ side and is separated from the transistor chips $3a$ to $3j$. The wiring substrate 20 is a general-purpose printed circuit board and has a 3-layer wiring structure, for example, but is not limited to this example. More specifically, as illustrated in FIGS. 3, 5, and 6, a first-layer wiring layer $22a$, an insulating board $21a$, a second-layer wiring layer $22b$, an insulating board $21b$, and a third-layer wiring layer $22c$ are arranged in that order starting from the transistor chip side.

Figure 6:
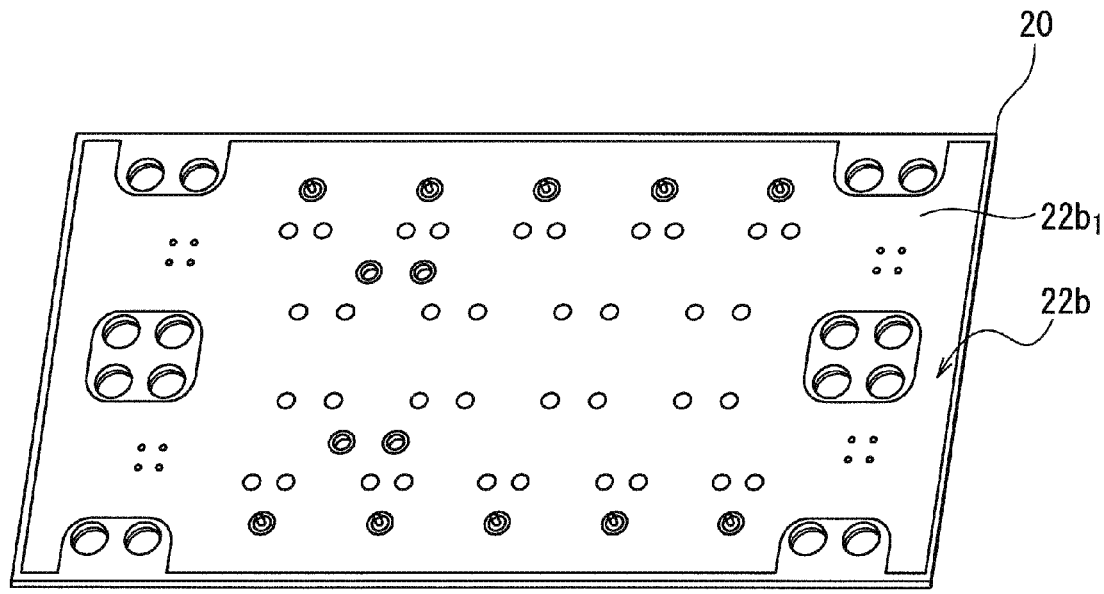
FIG. 6 is a perspective view schematically illustrating a second-layer wiring layer of the wiring substrate in the semiconductor unit according to Embodiment 1 of the present invention.

As illustrated in FIG. 6, a conductive plate $22b_1$ constituted by a large-area planar pattern is formed in the second-layer wiring layer $22b$. Similarly, a conductive plate constituted by a large-area planar pattern is also formed in the first-layer wiring layer $22a$, although this is not illustrated in the figures. The first-layer wiring layer $22a$ and the second-layer wiring layer $22b$ are used as current paths for transmitting primary circuit current.

Figure 5:
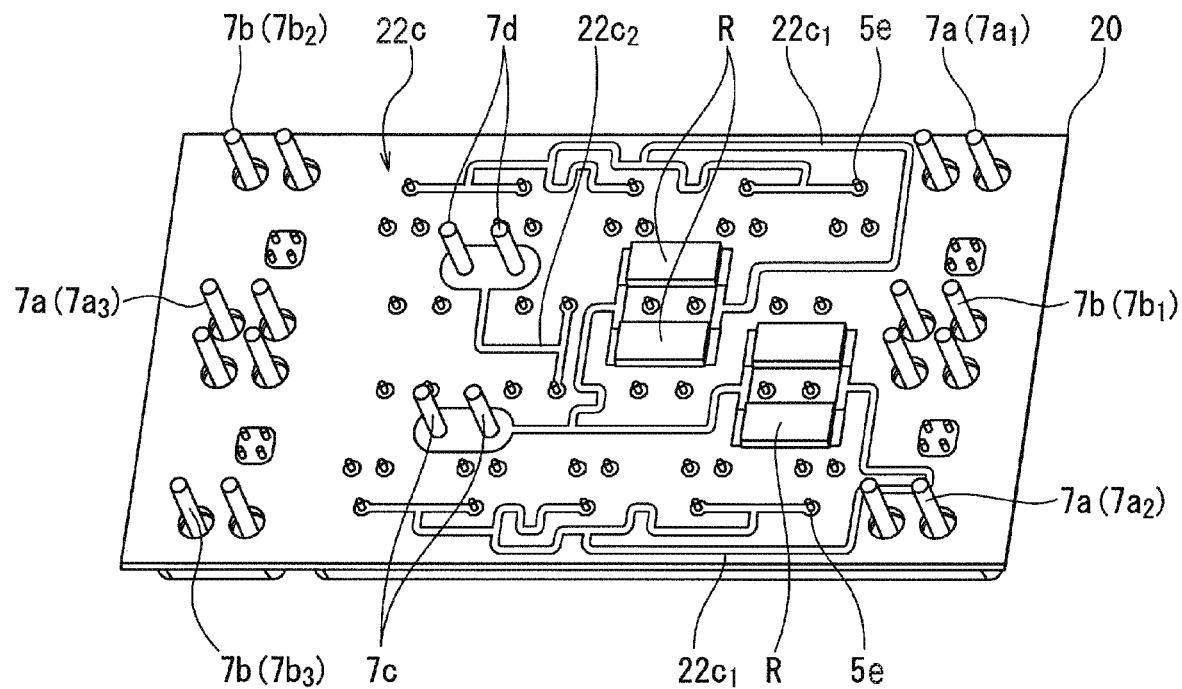
FIG. 5 is a perspective view schematically illustrating a third-layer wiring layer of a wiring substrate in the semiconductor unit according to Embodiment 1 of the present invention.

As illustrated in FIG. 5, gate lines $22c_1$ that electrically connect the control terminals $7c$ and the fifth conductive posts $5e$, an auxiliary source line $22c_2$ that electrically connects the auxiliary terminals $7d$ and the sixth conductive posts $5f$, and the like are formed in the third-layer wiring layer $22c$.

As illustrated in FIGS. 3, 4, and 5, the plurality of first conductive posts $5a$ are electrically and mechanically connected on one end side to one or both of the first-layer conductive plate and the second-layer conductive plate $22b_1$ of the wiring substrate 20 via through holes in the wiring substrate 20 and are electrically and mechanically connected on the other end side to the source electrodes (S) of the corresponding transistor chips $3a$ to $3j$. In other words, the first conductive posts $5a$ stand up going from the source electrodes (S) of the transistor chips towards the wiring substrate 20 and are connected to one or both of the wiring layers $22a$ and $22b$ of the wiring substrate 20 via through holes in the wiring substrate 20.

The plurality of second conductive posts $5b$ are electrically and mechanically connected on one end side to one or both of the first-layer conductive plate and the second-layer conductive plate $22b_1$ of the wiring substrate 20 via through holes in the wiring substrate 20 and are electrically and mechanically connected on the other end side to the second conductor layer $12b$ of the insulated circuit board 10. In other words, the second conductive posts $5b$ stand up from the second conductor layer $12b$ of the insulated circuit board 10 and are connected to one or both of the wiring layers $22a$ and $22b$ of the wiring substrate 20 via through holes in the wiring substrate 20.

The plurality of third conductive posts $5c$ are electrically and mechanically connected on one end side to one or both of the first-layer conductive plate and the second-layer conductive plate $22b_1$ of the wiring substrate 20 via through holes in the wiring substrate 20 and are electrically and mechanically connected on the other end side to the third conductor layer $12c_1$ of the insulated circuit board 10. In other words, the third conductive posts $5c$ stand up from the third conductor layer $12c_1$ of the insulated circuit board 10 and are connected to one or both of the wiring layers $22a$ and $22b$ of the wiring substrate 20 via through holes in the wiring substrate 20.

The plurality of fourth conductive posts $5d$ are electrically and mechanically connected on one end side to one or both of the first-layer conductive plate and the second-layer conductive plate $22b_1$ of the wiring substrate 20 via through holes in the wiring substrate 20 and are electrically and mechanically connected on the other end side to the third conductor layer $12c_2$ of the insulated circuit board 10. In other words, the fourth conductive posts $5d$ stand up going from the third conductor layer $12c_2$ of the insulated circuit board 10 towards the wiring substrate 20 and are connected to one or both of the wiring layers $22a$ and $22b$ of the wiring substrate 20 via through holes in the wiring substrate 20.

The plurality of fifth conductive posts $5e$ are electrically connected on one end side to the gate lines $22c_1$ formed in the third-layer wiring layer $22c$ of the wiring substrate 20 via through holes in the wiring substrate 20 and are electrically and mechanically connected on the other end side to the gate electrodes (G) of the corresponding transistor chips $3a$ to $3j$. In other words, the fifth conductive posts $5e$ stand up going from the control electrodes (G) of the transistor chips ($3a$ to $3j$) towards the wiring substrate 20 and are connected to the gate lines $22c_1$ formed in the wiring layer $22c$ of the wiring substrate 20 via through holes in the wiring substrate 20.

The plurality of sixth conductive posts $5f$ are electrically and mechanically connected on one end side to one or both of the first-layer conductive plate and the second-layer conductive plate $22b_1$ of the wiring substrate 20 via through holes in the wiring substrate 20 and are electrically and mechanically connected on the other end side to the anode electrodes (A) of the corresponding diode chips $4a$ to $4h$. In other words, the sixth conductive posts $5f$ stand up going from the anode electrodes (A) of the diode chips towards the wiring substrate 20 and are connected to one or both of the wiring layers $22a$ and $22b$ of the wiring substrate 20 via through holes in the wiring substrate 20.

The first main circuit terminals $7a_1$ protrude out on one end side from the bottom of the recess $17a_1$ in the resin sealing body 9, have center portions going through through holes in the wiring substrate 20, and are electrically and mechanically connected on the other end side to the first conductor layer $12a$ of the insulated circuit board 10. The first main circuit terminals $7a_2$ protrude out on one end side from the bottom of the recess $17a_2$ in the resin sealing body 9, have center portions going through through holes in the wiring substrate 20, and are electrically and mechanically connected on the other end side to the first conductor layer $12a$ of the insulated circuit board 10. The first main circuit terminals $7a_3$ protrude out on one end side from the bottom of the recess $17a_3$ in the resin sealing body 9, have center portions going through through holes in the wiring substrate 20, and are electrically and mechanically connected on the other end side to the first conductor layer 12a of the insulated circuit board 10. In other words, the first main circuit terminals 7a (7$a_1$, 7$a_2$, and 7$a_3$) are electrically connected to the drain electrode (D) of each of the plurality of transistor chips 3a to 3j and to the cathode electrode (C) of each of the plurality of diode chips 4a to 4h via the first conductor layer 12a of the insulated circuit board 10.

The second main circuit terminals 7$b_1$ protrude out on one end side from the bottom of the recess 17$b_1$ in the resin sealing body 9, have center portions going through through holes in the wiring substrate 20, and are electrically and mechanically connected on the other end side to the second conductor layer 12b of the insulated circuit board 10. In other words, the second main circuit terminals 7$b_1$ are electrically connected to the wiring layers (22a and 22b) of the wiring substrate 20 via the second conductor layer 12b of the insulated circuit board 10 and the second conductive posts 5b and are furthermore respectively electrically connected to the source electrodes (S) of the plurality of transistor chips 3a to 3j via the first conductive posts 5a and to the anode electrodes (A) of the plurality of diode chips 4a to 4h via the sixth conductive posts 5f.

The second main circuit terminals 7$b_2$ protrude out on one end side from the bottom of the recess 17$b_2$ in the resin sealing body 9, have center portions going through through holes in the wiring substrate 20, and are electrically and mechanically connected on the other end side to the third conductor layer 12$c_1$ of the insulated circuit board 10. In other words, the second main circuit terminals 7$b_2$ are electrically connected to the wiring layers (22a and 22b) of the wiring substrate 20 via the third conductor layer 12$c_1$ of the insulated circuit board 10 and the third conductive posts 5c and are furthermore respectively electrically connected to the source electrodes (S) of the plurality of transistor chips 3a to 3j via the first conductive posts 5a and to the anode electrodes (A) of the plurality of diode chips 4a to 4h via the sixth conductive posts 5f.

The second main circuit terminals 7$b_3$ protrude out on one end side from the bottom of the recess 17$b_3$ in the resin sealing body 9, have center portions going through through holes in the wiring substrate 20, and are electrically and mechanically connected on the other end side to the third conductor layer 12$c_2$ of the insulated circuit board 10. In other words, the second main circuit terminals 7$b_3$ are electrically connected to the wiring layers (22a and 22b) of the wiring substrate 20 via the third conductor layer 12$c_2$ of the insulated circuit board 10 and the fourth conductive posts 5d and are furthermore respectively electrically connected to the source electrodes (S) of the plurality of transistor chips 3a to 3j via the first conductive posts 5a and to the anode electrodes (A) of the plurality of diode chips 4a to 4h via the sixth conductive posts 5f.

The control terminals 7c protrude out on one end side from the bottom of the recess 17c in the resin sealing body 9 and are electrically connected on the other end side to the gate lines 22$c_1$ of the wiring substrate 20. In other words, the control terminals 7c are electrically connected to the control electrodes (G) of the plurality of transistor chips 3a to 3j via the gate lines 22$c_1$ of the wiring substrate 20, resistors R which are connected in series to these gate lines 22$c_1$, and the conductive posts 5e.

The auxiliary terminals 7d protrude out on one end side from the bottom of the recess 17d in the resin sealing body 9 and are electrically connected on the other end side to the auxiliary source line 22$c_2$ of the wiring substrate 20. In other words, the auxiliary terminals 7d are electrically connected to the conductive plate 22$b_1$ via the auxiliary source line 22$c_2$ of the wiring substrate 20 and are furthermore respectively electrically connected to the source electrodes (S) of the plurality of transistor chips 3a to 3j via the first conductive posts 5a and to the anode electrodes (A) of the plurality of diode chips 4a to 4h via the sixth conductive posts 5f.

As illustrated in FIG. 4, the transistor chips 3a to 3j are arranged on the first conductor layer 12a of the insulated circuit board 10 in two parallel rows running in the lengthwise direction of the resin sealing body 9. More specifically, the transistor chips 3a to 3e are arranged in a row running along one lengthwise side 10c of the insulated circuit board 10. Moreover, the transistor chips 3f to 3j are arranged in a row running along the other lengthwise side 10c of the insulated circuit board 10. In other words, the transistor chips 3a to 3j are arranged in two parallel rows.

The diode chips 4a to 4h are arranged in rows in the center of the insulated circuit board 10 between the row of transistor chips 3a to 3e and the row of transistor chips 3f to 3j. The diode chips 4a to 4d are arranged on the transistor chip 3a to 3e side, and the diode chips 4e to 4h are arranged on the transistor chip 3f to 3j side. Note that although Embodiment 1 is described as using ten transistor chips 3a to 3j and eight diode chips 4a to 4h, the numbers of these chips are not limited to this example.

The second conductor layer 12b and the third conductor layers 12$c_1$ and 12$c_2$ are positioned at least partially on the respective lines along which the row of transistor chips 3a to 3e and the row of transistor chips 3f to 3j extend. Moreover, the second conductive posts 5b that are connected to one end among the two ends positioned on opposite sides from one another in the lengthwise direction of the second conductor layer 12b as well as the third conductive posts 5c that are on the third conductor layer 12$c_1$ are positioned on the line along which the row of transistor chips 3a to 3e extends. Furthermore, the second conductive posts 5b that are connected to the other end among the two ends positioned on opposite sides from one another in the lengthwise direction of the second conductor layer 12b as well as the fourth conductive posts 5d that are on the third conductor layer 12$c_2$ are positioned on the line along which the row of transistor chips 3f to 3j extends.

Next, the flow of primary circuit current in the semiconductor unit 1 will be described.

As illustrated in FIG. 2, in the semiconductor unit 1 of Embodiment 1, a "D terminal (first main circuit terminals 7$a_1$)-S terminal (second main circuit terminals 7$b_1$)-D terminal (first main circuit terminal 7$a_2$)" group is arranged on the one short side 9a side of the resin sealing body 9, and an "S terminal (second main circuit terminals 7$b_2$)-D terminal (first main circuit terminals 7$a_3$)-S terminal (second main circuit terminals 7$b_3$)" group is arranged on the other short side 9b side of the resin sealing body 9. Therefore, here Embodiment 1 will be described using an example in which a DC voltage is applied with the first main circuit terminals 7$a_1$ and 7$a_2$ on the one short side 9a side of the resin sealing body 9 as the positive electrode and the second main circuit terminals 7$b_2$ and 7$b_3$ on the other short side 9b side of the resin sealing body 9 as the negative electrode.

FIGS. 3 and 4 illustrate current paths corresponding to when the switching device Tr of the semiconductor unit 1 is conducting current. In FIGS. 3 and 4, the arrows Ar$_1$ show outgoing paths (first half) for primary circuit current that flows from the first main circuit terminals 7$a_1$ and 7$a_2$ through the first conductor layer 12a of the insulated circuit board 10 to the transistor chips 3a to 3j, and the arrows Ar$_2$ show return paths (second half) for primary circuit current that flows from the transistor chips 3a to 3j through the wiring substrate 20 to the second conductive posts 5b. Moreover, the arrows $Ar_3$ show return paths (second half) for primary circuit current that flows from the second conductive posts 5b through the second conductor layer 12b of the insulated circuit board 10 to the second main circuit terminals $7b_1$.

Applying a gate voltage from the control terminals 7d to the control electrode (G) of each of the transistor chips 3a to 3j via the gate lines $22c_1$ of the wiring substrate 20, the resistors (impedance regulators)R, and the conductive posts 5e causes each of the transistor chips 3a to 3j to enter a current-conducting state. Primary circuit current flows from the first main circuit terminals $7a_1$ and $7a_2$ through the first conductor layer 12a of the insulated circuit board 10 on the outgoing paths and then vertically through the transistor chips 3a to 3j from the drain electrode (D) to the source electrode (S) of each of the transistor chips 3a to 3j. Next, the primary circuit current flows from the respective source electrodes (S) of the transistor chips 3a to 3j through the first conductive posts 5a to one or both of the wiring layers 22a and 22b of the wiring substrate 20 on the return paths. Then, the primary circuit current on the return paths flows through the second conductive posts 5b and the second conductor layer 12b of the insulated circuit board 10 to the second main circuit terminals $7b_1$. Note that in FIGS. 3 and 4, the paths for current that flows from the first main circuit terminals $7a_1$ and $7a_2$ through the endmost transistor chips 3e and 3j are illustrated as representative examples.

Moreover, during freewheeling operation of the semiconductor unit 1, the switching device Tr in FIG. 2 is cut off, the rectifier Di enters a current-conducting state, and freewheeling current flows from the second main circuit terminals $7b_1$ to the first main circuit terminals $7a_1$ and $7a_2$. Although this is not illustrated in the figures, this freewheeling current flows from the second main circuit terminals $7b_1$ through the second conductor layer 12b of the insulated circuit board 10, the conductive posts 5b, the wiring layers (22a and 22b) of the wiring substrate 20, and the sixth conductive posts 5f to the respective anode electrodes (A) of the diode chips 4a to 4h. Next, the freewheeling current flows from the anode electrode (A) to the cathode electrode (C) of each of the diode chips 4a to 4h and through the first conductor layer 12a of the insulated circuit board 10 to the first main circuit terminals $7a_1$ and $7a_2$.

In the semiconductor unit 1 according to Embodiment 1, on one lengthwise end of the resin sealing body 9 (the right end in FIG. 2), the first main circuit terminals $7a_1$ and $7a_2$ are arranged in both corners so as to be on either side of the second main circuit terminals 7b in the widthwise direction of the resin sealing body 9. Moreover, the transistor chips 3a to 3e are arranged in a row running in the lengthwise direction along one edge of the insulated circuit board 10 on the side on which the first main circuit terminals $7a_1$ are arranged (the upper edge in FIG. 4). The transistor chips 3f to 3j are arranged in a row running in the lengthwise direction along the other edge of the insulated circuit board 10 on the side on which the first main circuit terminals $7a_2$ are arranged (the lower edge in FIG. 4). This makes it possible to arrange the first main circuit terminals $7a_1$ and $7a_2$ and the second main circuit terminals $7b_1$ near one another. The primary circuit current of the semiconductor unit 1 flows from the first main circuit terminals $7a_1$ and $7a_2$ along outgoing current paths through the first conductor layer 12a of the insulated circuit board 10 and to the respective drain electrodes (D) of the row of transistor chips 3a to 3e and the row of transistor chips 3f to 3j. Next, the primary circuit current flows through the respective source electrodes (S) of the row of transistor chips 3a to 3e and the row of transistor chips 3f to 3j, through return current paths going through the first conductive posts 5a and the wiring layers (22a and 22b) of the wiring substrate 20, and through the second conductive posts 5b and the second conductor layer 12b to the second main circuit terminals $7b_1$. In the semiconductor unit 1 according to Embodiment 1, on the outgoing paths for the primary circuit current, current can be respectively passed from the first main circuit terminals $7a_1$ and $7a_2$ to the row of transistor chips 3a to 3e and the row of transistor chips 3f to 3j with good linearity. Moreover, on the return paths for the primary circuit current, current can be respectively passed from the row of transistor chips 3a to 3e and the row of transistor chips 3f to 3j to the second conductive posts 5b with good linearity. In this way, the outgoing paths and return paths on the current paths along which the primary circuit current flows are arranged near one another in a parallel manner, with the respective current directions being substantially opposite. Furthermore, the degree of parallelism between the outgoing paths and return paths for the primary circuit current is high. This, due to the effects of mutual inductance, makes it possible to reduce mutual inductance on the current paths between the first main circuit terminals $7a_1$ and $7a_2$ and the second main circuit terminals $7b_1$ of the semiconductor unit 1.

<Semiconductor Module>

Next, a first semiconductor module 2A and a second semiconductor module 2B each including two of the semiconductor units 1 according to Embodiment 1 will be described.

First, the first semiconductor module 2A will be described.

Figure 7:
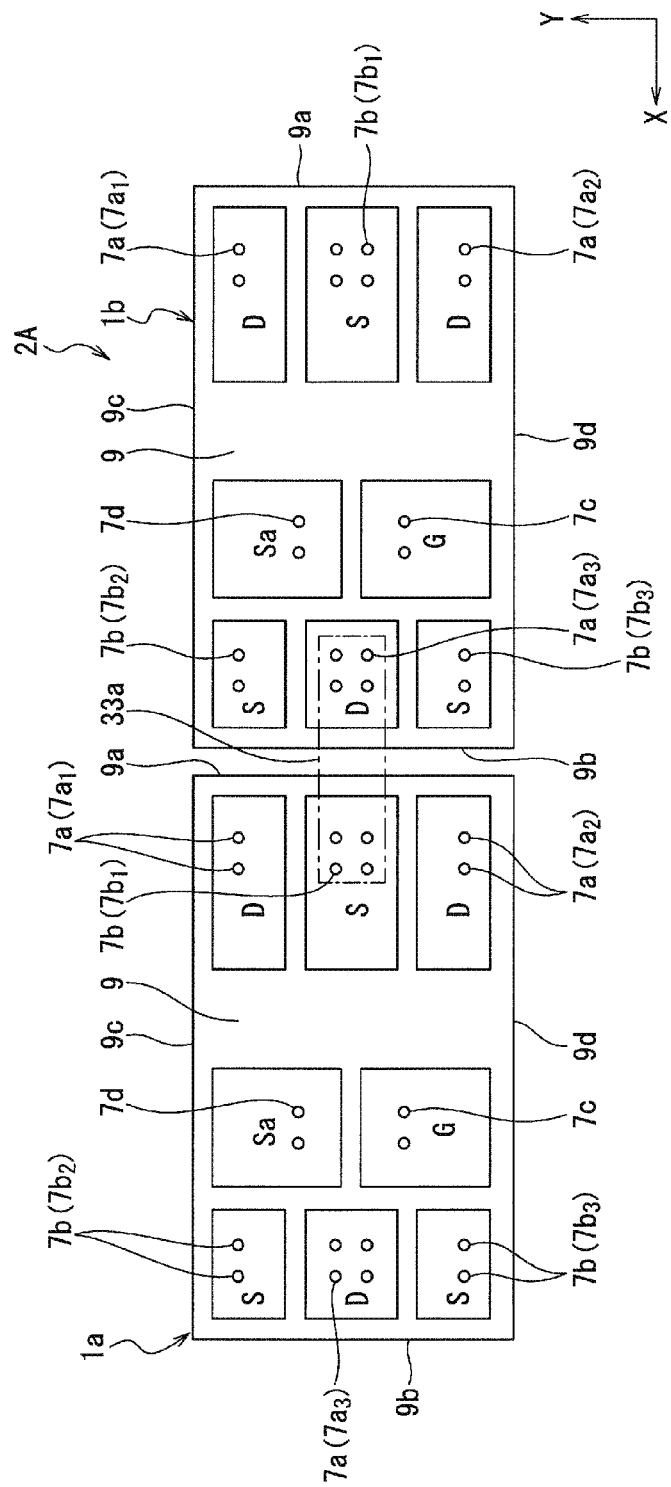
FIG. 7 is a plan view schematically illustrating an example of a first semiconductor module according to Embodiment 1 of the present invention.
Figure 8:
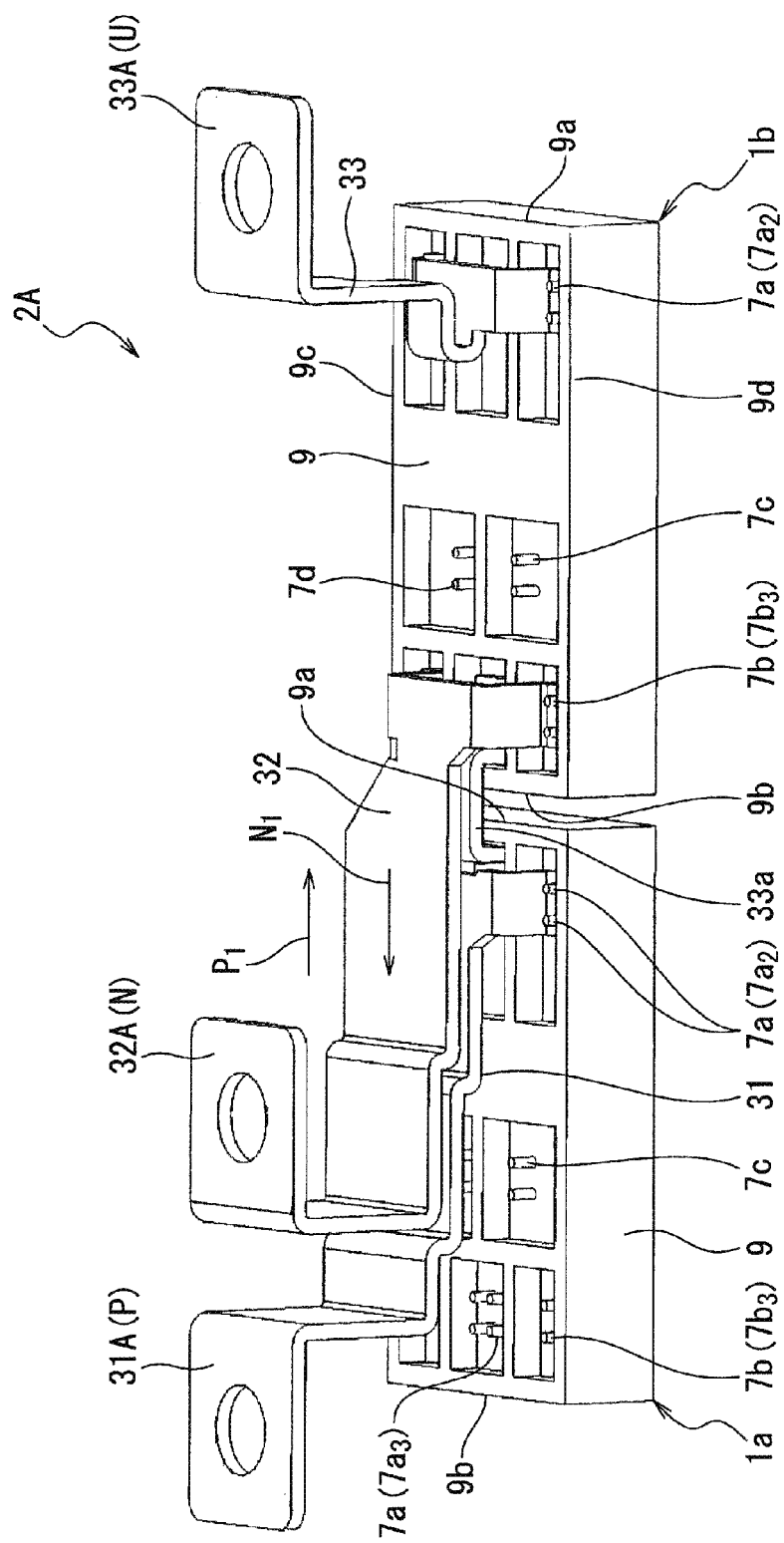
FIG. 8 is a perspective view schematically illustrating examples of external terminals in the first semiconductor module according to Embodiment 1 of the present invention.

As illustrated in FIGS. 7 and 8, the first semiconductor module 2A according to Embodiment 1 includes semiconductor units 1 according to Embodiment 1 as a first semiconductor unit 1a and a second semiconductor unit 1b. The first semiconductor module 2A is a two-in-one semiconductor module including the first semiconductor unit 1a and second semiconductor unit 1b according to Embodiment 1 and can be used as a half-wave rectifier circuit in which the first semiconductor unit 1a is an upper arm and the second semiconductor unit 1b is a lower arm.

As illustrated in FIG. 7, the first and second semiconductor units 1a and 1b (the upper arm semiconductor unit 1a and the lower arm semiconductor unit 1b) are arranged with the one short side 9a side of the resin sealing body 9 of the first semiconductor unit 1a (the upper arm) and the other short side 9b side of the resin sealing body 9 of the second semiconductor unit 1b (the lower arm) facing one another. In other words, the first semiconductor module 2A according to Embodiment 1 has a unit arrangement in which the first terminal array (D-S-D) on the one short side 9a side of the first semiconductor unit 1a and the second terminal array (S-D-S) on the other short side 9b side of the second semiconductor unit 1b face one another.

Moreover, as illustrated in FIGS. 7 and 8, the first semiconductor module 2A includes a positive connector 31 which is electrically and mechanically connected on one end side to the first main circuit terminals 7a ($7a_1$ and $7a_2$) of the first terminal array (on the one short side 9a side) of the first semiconductor unit 1a and has a positive external terminal 31A (P) on the other end side.

The first semiconductor module 2A further includes a negative connector 32 which is electrically and mechanically connected on one end side to the second main circuit terminals 7b ($7b_2$ and $7b_3$) of the second terminal array (on the other short side 9b side) of the second semiconductor unit 1b and has a negative external terminal 32A (N) on the other end side.

In addition, the first semiconductor module 2A includes an output connector 33 which is electrically and mechanically connected on one end side to the first main circuit terminals 7a (7$a_1$ and 7$a_2$) of the first terminal array (on the one short side 9a side) of the second semiconductor unit 1b and has an output external terminal 33A (U) on the other end side.

The first semiconductor module 2A further includes an intermediate connector 33a which is electrically and mechanically connected on one end side to the second main circuit terminals 7b (7$b_1$) of the first terminal array (on the one short side 9a side) of the first semiconductor unit 1a and is electrically and mechanically connected on the other end side to the first main circuit terminals 7a (7$a_3$) of the second terminal array (on the other short side 9b side) of the second semiconductor unit 1b.

The positive connector 31 extends, parallel to the upper surface of the first semiconductor unit 1a, from the first terminal array side (one short side 9a side) towards the second terminal array side (other short side 9b side) of the first semiconductor unit 1a.

The negative connector 32 is arranged near and parallel to the positive connector 31 and extends towards the second terminal array side (other short side 9b side) of the first semiconductor unit 1a. The output connector 33 extends in the vertical direction (Z direction) from the resin sealing body 9 on the first terminal array side (one short side 9a side) of the second semiconductor unit 1b.

Near the other side 9b of the first semiconductor unit 1a, the positive external terminal 31A and the negative external terminal 32A are arranged near one another and above or near the first semiconductor unit 1a. This makes it possible to shorten the positive connector 31, the negative connector 32, and the output connector 33.

The positive connector 31 and the negative connector 32 are arranged with the primary surfaces of each separated from and facing one another, and the primary surfaces of each are arranged parallel to the upper surface of the first semiconductor unit 1a (the upper surface of the resin sealing body 9).

Figure 9:
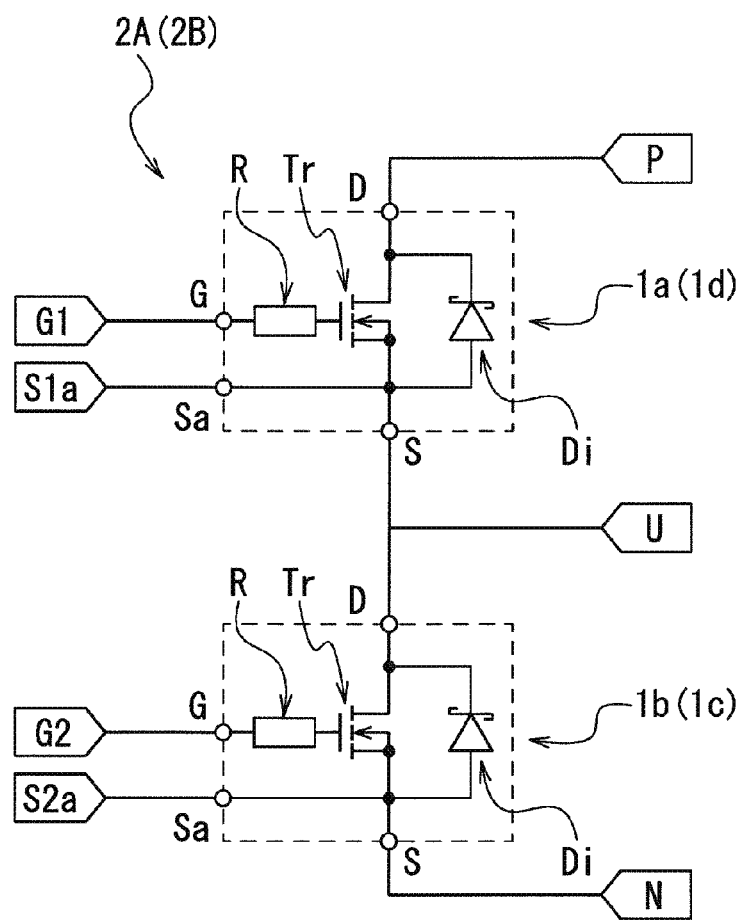
FIG. 9 is an equivalent circuit diagram illustrating an example of the first semiconductor module according to Embodiment 1 of the present invention.

FIG. 9 illustrates an equivalent circuit diagram of the first semiconductor module 2A according to Embodiment 1. The P terminal in FIG. 9 corresponds to the positive external terminal 31A in FIG. 8. The N terminal in FIG. 9 corresponds to the negative external terminal 32A in FIG. 8. The U terminal in FIG. 9 corresponds to the output external terminal 33A in FIG. 8. The G1 terminal and the S1a terminal in FIG. 9 are respectively electrically connected to the gate electrode G (control terminals 7c) and the auxiliary source electrode Sa (auxiliary terminals 7d) of the first semiconductor unit 1a. The G2 terminal and the S2a terminal in FIG. 9 are respectively electrically connected to the gate electrode G (control terminals 7c) and the auxiliary source electrode Sa (auxiliary terminals 7d) of the second semiconductor unit 1b.

As illustrated in FIG. 9, in the first semiconductor module 2A according to Embodiment 1, a positive electrode and a negative electrode of an external power supply are connected to the positive external terminal 31A and the negative external terminal 32A. When primary circuit current is passed between the positive external terminal 31A and the negative external terminal 32A, this primary circuit current flows in opposite directions on the current paths along the positive connector 31 and the negative connector 32 which are arranged near and parallel to one another. In other words, as illustrated in FIG. 8, in the positive external terminal 31A the primary circuit current flows in the direction of the arrow $P_1$, and in the negative external terminal 32A the primary circuit current flows in the direction of the arrow $N_1$. This makes it possible to reduce parasitic inductance on the external current paths constituted by the positive connector 31 that is connected to the first main circuit terminals 7$a_1$ and 7$a_2$ of the first terminal array of the first semiconductor unit 1a and the negative connector 32 that is connected to the second main circuit terminals 7$b_2$ and 7$b_3$ of the second terminal array of the second semiconductor unit 1b.

As described above, in the first semiconductor unit 1a and the second semiconductor unit 1b used in the first semiconductor module 2A according to Embodiment 1, the mutual inductance between the first main circuit terminals 7a and the second main circuit terminals 7b can be reduced. Moreover, the mutual inductance between the positive connector 31 and the negative connector 32 of the first semiconductor module 2A according to Embodiment 1 can also be reduced. Therefore, in the first semiconductor module 2A according to Embodiment 1, the respective parasitic inductance of each current path going from the positive external terminal 31A to the negative external terminal 32A can be reduced. This makes it possible to reduce the overall parasitic inductance of the first semiconductor module 2A, thereby making it possible to suppress surge voltages applied during switching operation of the first semiconductor module 2A. Moreover, the positive connector 31, the negative connector 32, and the output connector 33 can be shortened, thereby making it possible to miniaturize the first semiconductor module 2A. Furthermore, in the first semiconductor module 2A according to Embodiment 1, the positive external terminal 31A, the negative external terminal 32A, and the output external terminal 33A are arranged in that order in a row running in the lengthwise direction of the first semiconductor module 2A, similar to in a conventional two-in-one semiconductor module. Therefore, the first semiconductor module 2A according to Embodiment 1 can easily be used in place of a conventional two-in-one semiconductor module.

Next, the second semiconductor module 2B will be described.

Figure 10:
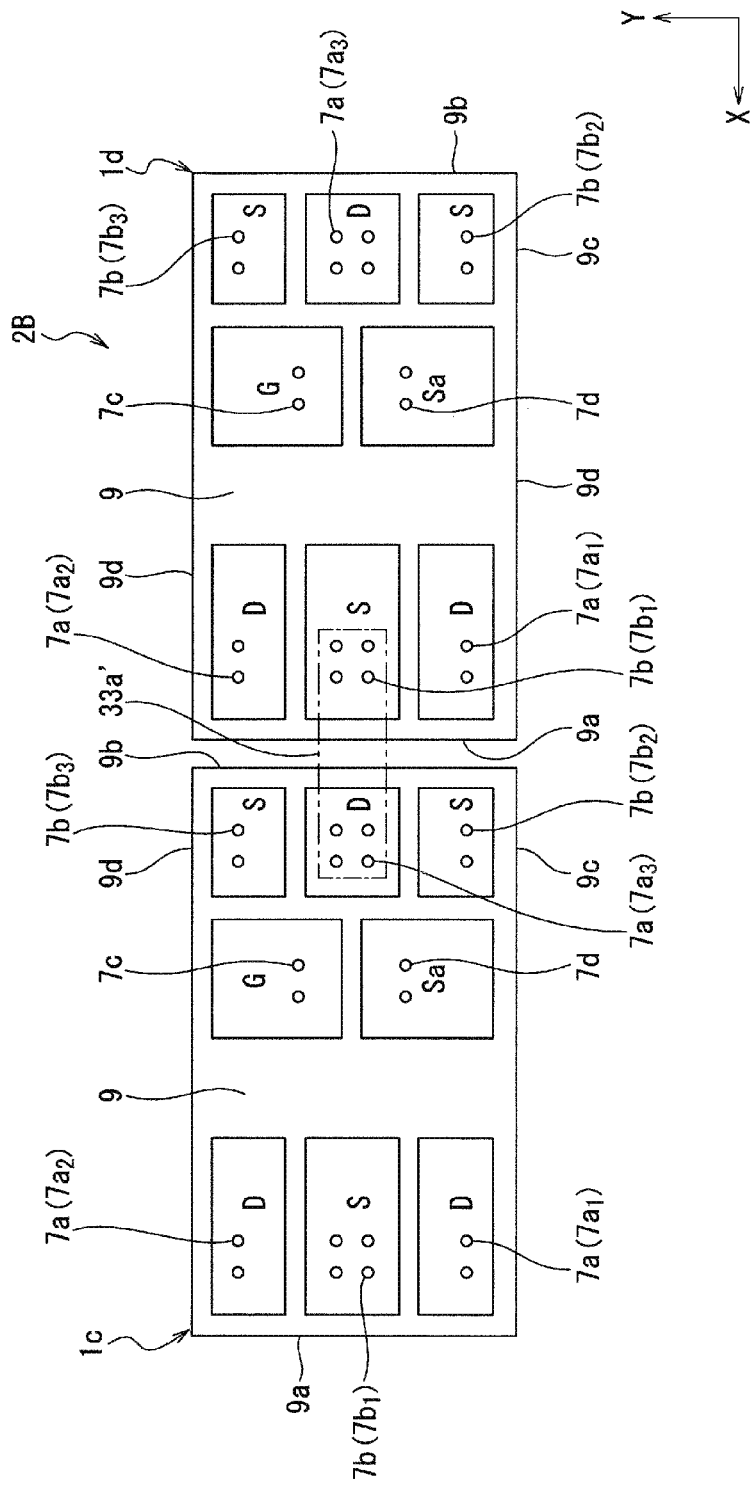
FIG. 10 is a plan view schematically illustrating an example of a second semiconductor module according to Embodiment 1 of the present invention.

As illustrated in FIG. 10, the second semiconductor module 2B according to Embodiment 1 includes semiconductor units 1 according to Embodiment 1 as a third semiconductor unit 1c and a fourth semiconductor unit 1d. The second semiconductor module 2B is a two-in-one semiconductor module including the third semiconductor unit 1c and fourth semiconductor unit 1d according to Embodiment 1 and can be used as a half-wave rectifier circuit in which the third semiconductor unit 1c is a lower arm and the fourth semiconductor unit 1d is an upper arm.

As illustrated in FIG. 10, the third and fourth semiconductor units 1c and 1d are arranged with the other short side 9b side of the resin sealing body 9 of the third semiconductor unit 1c (the lower arm semiconductor unit) and the one short side 9a side of the resin sealing body 9 of the fourth semiconductor unit 1d (the upper arm semiconductor unit) facing one another. In other words, unlike the first semiconductor module 2A described above, the second semiconductor module 2B according to Embodiment 1 has a unit arrangement in which the second terminal array (S-D-S) on the other short side 9b side of the third semiconductor unit 1c and the first terminal array (D-S-D) on the one short side 9a side of the fourth semiconductor unit 1d face one another.

Figure 11A:
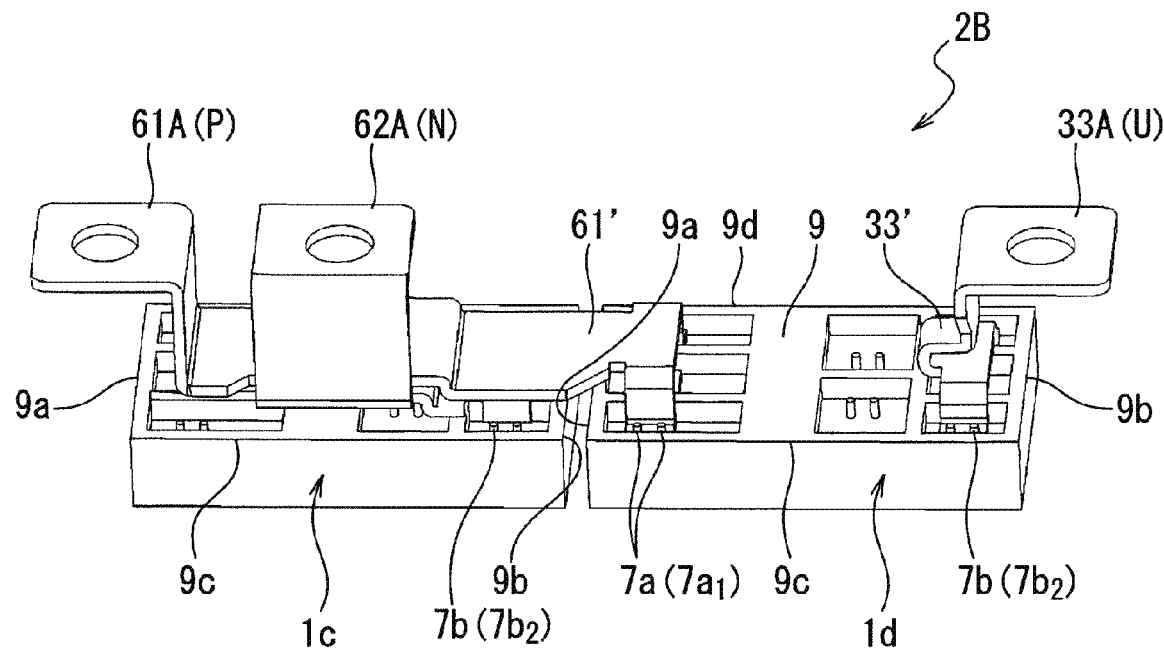
FIGS. 11A and 11B illustrates examples of external terminals in the second semiconductor module according to Embodiment 1 of the present invention (where FIG. 11A is a perspective view and FIG. 11B is a side view).
Figure 11B:
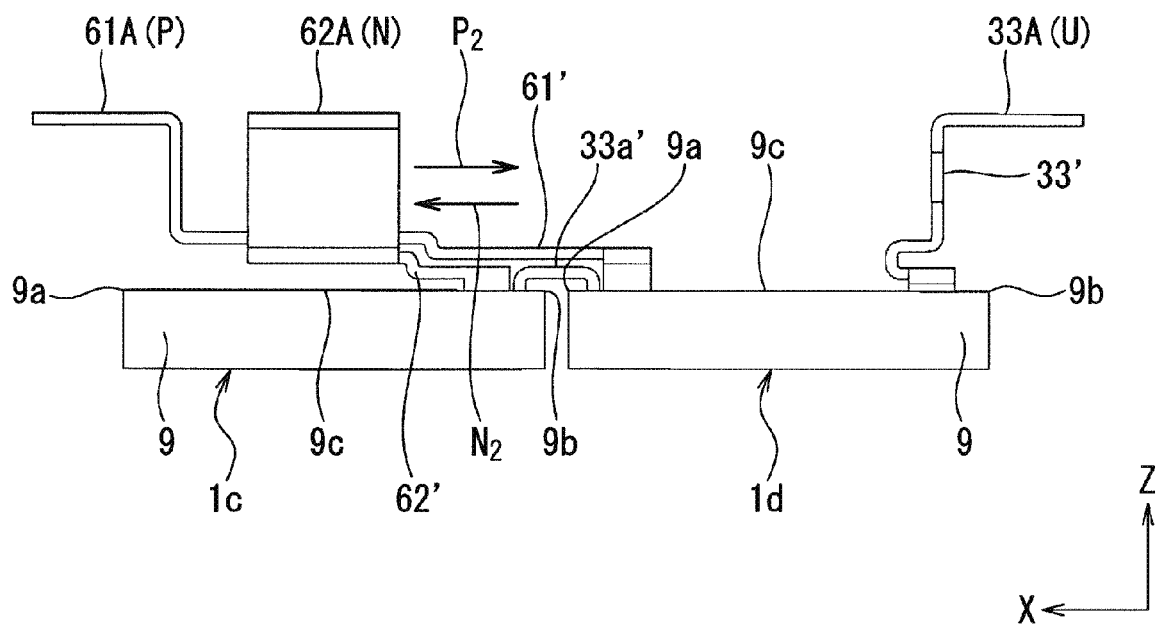

Moreover, as illustrated in FIGS. 10, 11A, and 11B, the second semiconductor module 2B includes a positive connector 61' which is electrically and mechanically connected on one end side to the first main circuit terminals 7a (7a$_1$ and 7a$_2$) of the first terminal array (on the one short side 9a side) of the fourth semiconductor unit 1d and has a positive external terminal 61A (P) on the other end side.

The second semiconductor module 2B further includes a negative connector 62' which is electrically and mechanically connected on one end side to the second main circuit terminals 7b (7b$_2$ and 7b$_3$) of the second terminal array (on the other short side 9b side) of the third semiconductor unit 1c and has a negative external terminal 62A (N) on the other end side.

In addition, the second semiconductor module 2B includes an output connector 33' which is electrically and mechanically connected on one end side to the second main circuit terminals 7b (7b$_1$ and 7b$_2$) of the second terminal array (on the other short side 9b side) of the fourth semiconductor unit 1d and has an output external terminal 33A (U) on the other end side.

The second semiconductor module 2B further includes an intermediate connector 33a' which is electrically and mechanically connected on one end side to the first main circuit terminals 7a (7a$_3$) of the second terminal array (on the other short side 9b side) of the third semiconductor unit 1c and is electrically and mechanically connected on the other end side to the second main circuit terminals 7b (7b$_1$) of the first terminal array (on the one short side 9a side) of the fourth semiconductor unit 1d.

The positive connector 61' extends, parallel to the upper surface of the third semiconductor unit 1c, from the first terminal array side (one short side 9a side) of the fourth semiconductor unit 1d towards the first terminal array side (one short side 9a side) of the third semiconductor unit 1c.

The negative connector 62' is arranged near and parallel to the positive connector 61' and extends towards the first terminal array side (the 9a side) of the third semiconductor unit 1c. The output connector 33' extends in the vertical direction (Z direction) from the resin sealing body 9 on the second terminal array side (other short side 9b side) of the fourth semiconductor unit 1d.

Near the one side 9a of the third semiconductor unit 1c, the positive external terminal 61A (P) and the negative external terminal 62A (N) are arranged near one another and above or near the third semiconductor unit 1c. This makes it possible to shorten the positive connector 61', the negative connector 62', and the output connector 33'.

The positive connector 61' and the negative connector 62' are arranged with the primary surfaces of each separated from and facing one another, and the primary surfaces of each are arranged parallel to the upper surface of the third semiconductor unit 1c (the upper surface of the resin sealing body 9).

The semiconductor module 2B according to Embodiment 1 can be represented by the same equivalent circuit as the first semiconductor module 2A according to Embodiment 1. In other words, referring to FIG. 9, the P terminal in FIG. 9 corresponds to the positive external terminal 61A (P) in FIGS. 11A and 11B. The N terminal in FIG. 9 corresponds to the negative external terminal 62A (N) in FIGS. 11A and 11B. The U terminal in FIG. 9 corresponds to the output external terminal 33A in FIGS. 11A and 11B. The G1 terminal and the S1a terminal in FIG. 9 are respectively electrically connected to the gate electrode G (control terminals 7c) and the auxiliary source electrode Sa (auxiliary terminals 7d) of the third semiconductor unit 1c. The G2 terminal and the S2a terminal in FIG. 9 are respectively electrically connected to the gate electrode G (control terminals 7c) and the auxiliary source electrode Sa (auxiliary terminals 7d) of the fourth semiconductor unit 1d.

As illustrated in FIG. 9, in the second semiconductor module 2B according to Embodiment 1, a positive electrode and a negative electrode of an external power supply are connected to the positive external terminal 61A (P) and the negative external terminal 62A (N). When primary circuit current is passed between the positive external terminal 61A (P) and the negative external terminal 62A (N), this primary circuit current flows in opposite directions on the current paths along the positive connector 61' and the negative connector 62' which are arranged near and parallel to one another. In other words, as illustrated in FIGS. 11A and 11B, in the positive external terminal 61A (P) the primary circuit current flows in the direction of the arrow $P_2$, and in the negative external terminal 62A (N) the primary circuit current flows in the direction of the arrow $N_2$. This makes it possible to reduce parasitic inductance on the external current paths constituted by the positive connector 61' that is connected to the first main circuit terminals 7a$_1$ and 7a$_2$ of the first terminal array of the fourth semiconductor unit 1d and the negative connector 62' that is connected to the second main circuit terminals 7b (7b$_2$ and 7b$_3$) of the second terminal array of the third semiconductor unit 1c.

As described above, in the third semiconductor unit 1c and the fourth semiconductor unit 1d used in the second semiconductor module 2B according to Embodiment 1, the mutual inductance between the first main circuit terminals 7a and the second main circuit terminals 7b can be reduced. Moreover, the mutual inductance between the positive connector 61' and the negative connector 62' of the second semiconductor module 2B according to Embodiment 1 can also be reduced. Therefore, in the second semiconductor module 2B according to Embodiment 1, similar to in the first semiconductor module 2A described above, the respective parasitic inductance of each current path going from the positive external terminal 61A (P) to the negative external terminal 62A (N) can be reduced. This makes it possible to reduce the overall parasitic inductance of the second semiconductor module 2B, thereby making it possible to suppress surge voltages applied during switching operation of the second semiconductor module 2B. Moreover, the positive connector 61', the negative connector 62', and the output connector 33' can be shortened, thereby making it possible to miniaturize the second semiconductor module 2B. Furthermore, in the second semiconductor module 2B according to Embodiment 1, the positive external terminal 61A (P), the negative external terminal 62A (N), and the output external terminal 33A are arranged in that order in a row running in the lengthwise direction of the second semiconductor module 2B, similar to in a conventional two-in-one semiconductor module. Therefore, the second semiconductor module 2B according to Embodiment 1 can easily be used in place of a conventional two-in-one semiconductor module.

Here, in the semiconductor unit 1 according to Embodiment 1, the first terminal array (D-S-D) is arranged on the one short side 9a side of the two short sides 9a and 9b of the resin sealing body 9 that are positioned on opposite sides from one another, and the second terminal array (S-D-S) is arranged on the other short side 9b side. Furthermore, in the first semiconductor module 2A that includes semiconductor units 1 according to Embodiment 1 as the first semiconductor unit 1a and the second semiconductor unit 1b, a half-wave rectifier circuit is constructed by utilizing a unit arrangement in which the first terminal array (D-S-D) on the one short side 9a side of the first semiconductor unit 1a and the second terminal array (S-D-S) on the other short side 9b side of the second semiconductor unit 1b face one another. Meanwhile, in the second semiconductor module 2B that includes semiconductor units 1 according to Embodiment 1 as the third semiconductor unit 1c and the fourth semiconductor unit 1d, unlike in the unit arrangement of the first semiconductor module 2A, a half-wave rectifier circuit is constructed by utilizing a unit arrangement in which the second terminal array (S-D-S) on the other short side 9b side of the third semiconductor unit 1c and the first terminal array (D-S-D) on the one short side 9a side of the fourth semiconductor unit 1d face one another, relative to the positions of the positive, negative, and output external terminals. (However, as far as the arrangement of the semiconductor units 1c and 1d in the second semiconductor module 2B is concerned, the arrangement is identical to the arrangement of the semiconductor units 1a and 1b in the first semiconductor module 2A, as explained above except that it is rotated 180 degrees so as to be up-side down as compared with the second semiconductor module 2B. Just the arrangement of the positive and negative connectors/external terminals, and the connection point of the output terminal are different, as shown in FIGS. 8 and 11A-11B.) In other words, in the semiconductor unit 1 according to Embodiment 1, first main circuit terminals 7a and second main circuit terminals 7b are arranged on both of the two short side 9a and 9b sides that are positioned on opposite sides from one another. Therefore, when arranging two of the semiconductor units 1 with the terminal array sides thereof facing one another (9a-9a, 9b-9b, 9a-9b, or 9b-9a), regardless of which of the two short sides 9a and 9b on which terminal arrays are arranged is selected, first main circuit terminals 7a and second main circuit terminals 7b can be arranged near the facing short-side sides of the two semiconductor units 1. Furthermore, the connection between the first main circuit terminals 7a and the positive connector (31, 61') of one semiconductor unit 1; the connection between the second main circuit terminals 7b and the negative connector (32, 62') of the other semiconductor unit 1; and the connections between the first main circuit terminals 7a of the one semiconductor unit 1, the second main circuit terminals 7b of the other semiconductor unit 1, and the intermediate connector (33a, 33a') can be centralized near the facing short-side sides of the two semiconductor units 1. Thus, regardless of which of the two short sides 9a and 9b of the semiconductor units 1 are selected, the first and second semiconductor modules 2A and 2B can easily be constructed as half-wave rectifier circuits. Therefore, the semiconductor unit 1 according to Embodiment 1 offers high ease of use in construction of half-wave rectifier circuits.

Moreover, the main circuit terminals that have the same function (i.e., among the first main circuit terminals and among the second main circuit terminals) can be connected at a minimum distance across the two semiconductor units 1.

<Semiconductor Device>

Next, a semiconductor device 3A including the first semiconductor module 2A and the second semiconductor module 2B according to Embodiment 1 will be described with reference to FIGS. 12 to 15.

Figure 12:
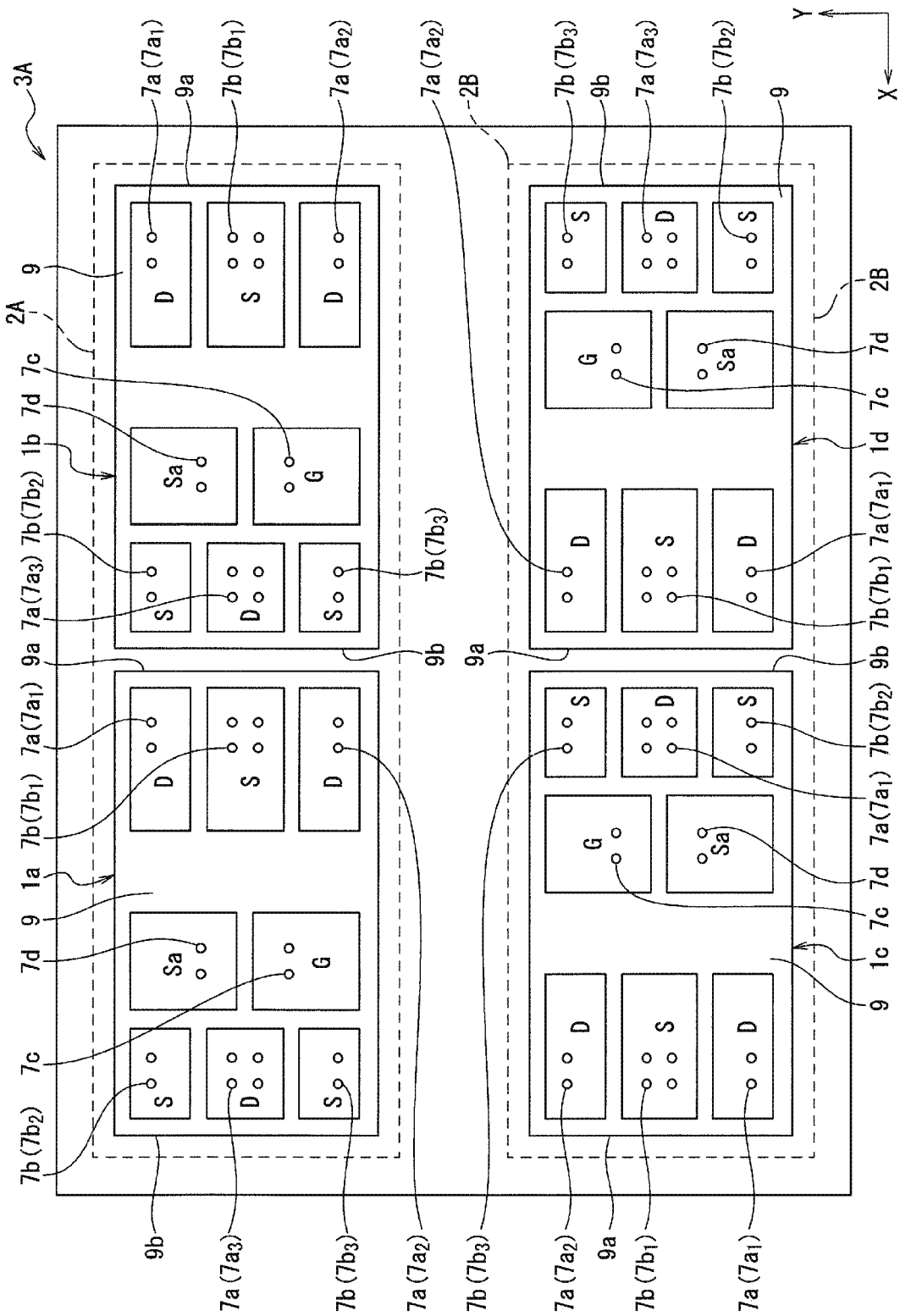
FIG. 12 is a plan view schematically illustrating an example of a semiconductor device according to Embodiment 1 of the present invention.
Figure 13:
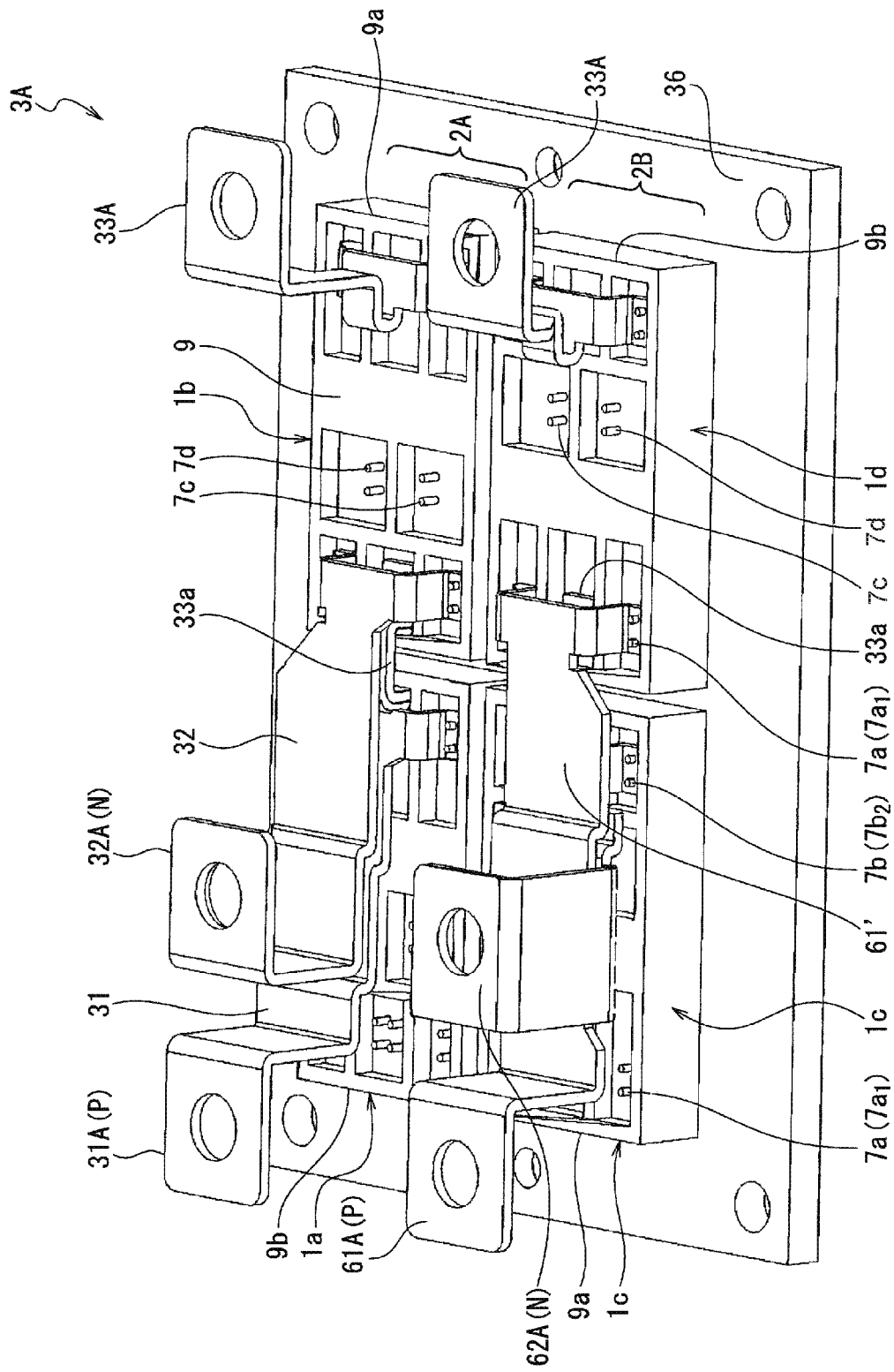
FIG. 13 is a perspective view schematically illustrating the example of the semiconductor device according to Embodiment 1 of the present invention.

As illustrated in FIGS. 12 and 13, the semiconductor device 3A according to Embodiment 1 has a module arrangement in which the first semiconductor module 2A and the second semiconductor module 2B are arranged side by side in the widthwise direction (Y direction) of the resin sealing bodies 9. Moreover, the first semiconductor module 2A and the second semiconductor module 2B are arranged with the first semiconductor unit 1a (upper arm) of the first semiconductor module 2A and the third semiconductor unit 1c (lower arm) of the second semiconductor module 2B being adjacent to one another in the widthwise direction of the resin sealing bodies 9 and the second semiconductor unit 1b (lower arm) of the first semiconductor module 2A and the fourth semiconductor unit 1d (upper arm) of the second semiconductor module 2B being adjacent to one another in the widthwise direction of the resin sealing bodies 9.

Figure 15:
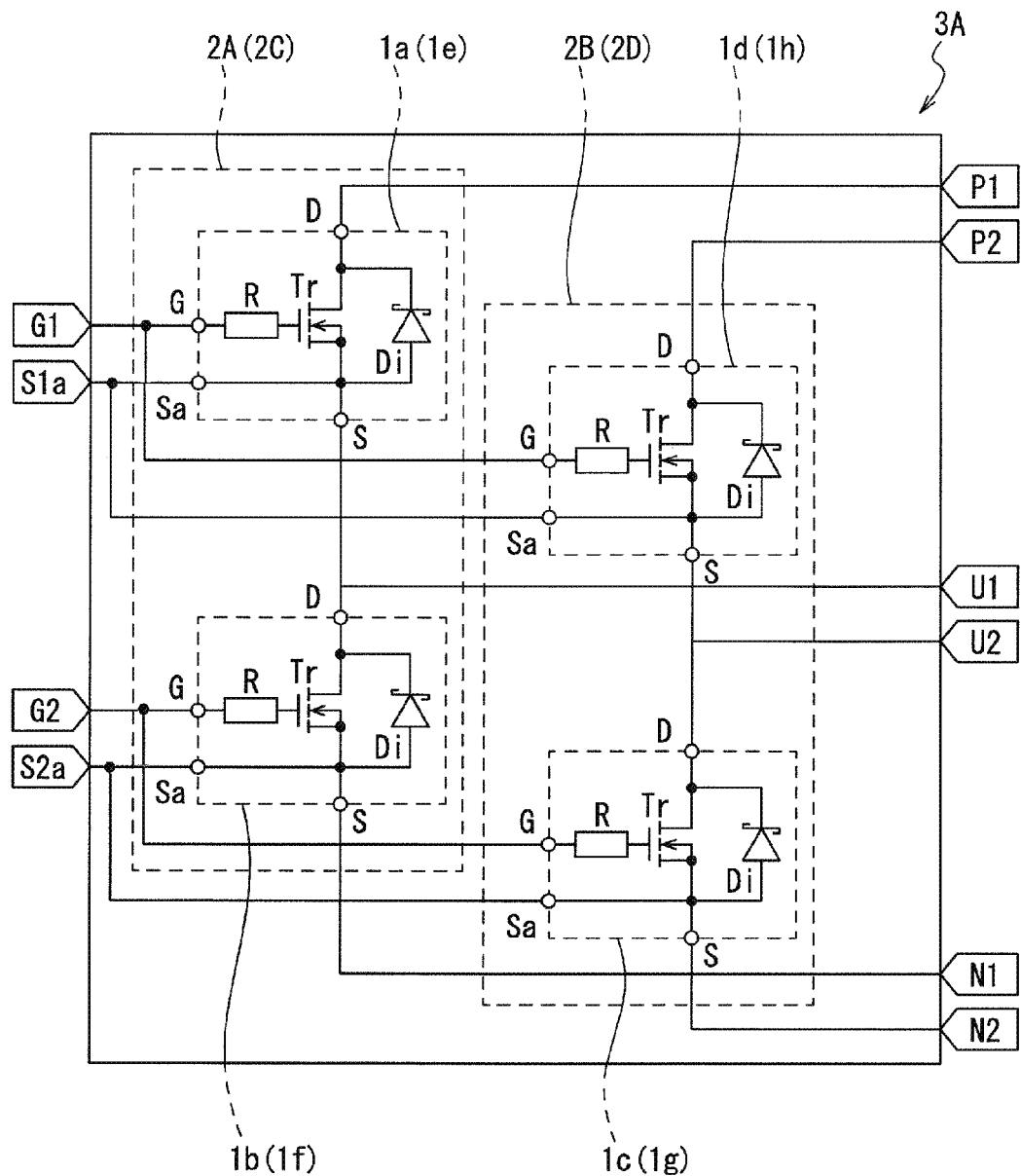
FIG. 15 is an equivalent circuit diagram illustrating an example of the semiconductor device according to Embodiment 1 of the present invention.

FIG. 15 is an equivalent circuit for the semiconductor device 3A according to Embodiment 1.

Figure 16:
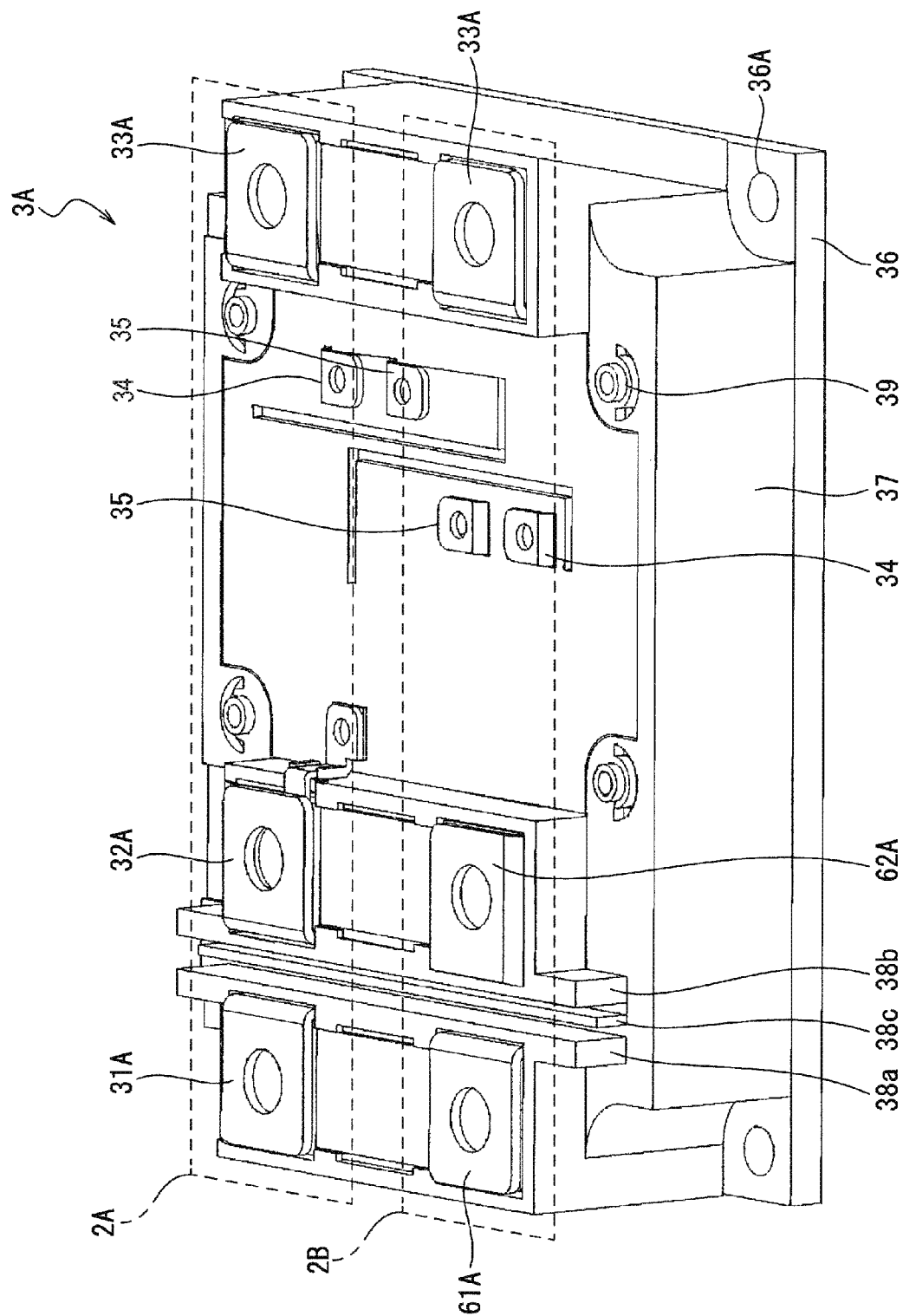
FIG. 16 is a perspective view illustrating an example of the semiconductor device according to Embodiment 1 of the present invention housed within an outer case.

The P1 terminal, N1 terminal, and U1 terminal in FIG. 15 respectively correspond to the positive external terminal 31A, negative external terminal 32A, and output external terminal 33A of the first semiconductor module 2A in FIG. 13. The G1 terminal and the S1a terminal in FIG. 15 respectively correspond to a control external terminal 34 and an auxiliary external terminal 35 of the first semiconductor module 2A as illustrated in FIG. 16. Moreover, the control external terminal 34 of the first semiconductor module 2A is electrically connected to each of the control terminals 7c of the first and fourth semiconductor units 1a and 1d illustrated in FIGS. 12 and 13. Furthermore, the auxiliary external terminal 35 of the first semiconductor module 2A is electrically connected to each of the auxiliary terminals 7d of the first and fourth semiconductor units 1a and 1d illustrated in FIGS. 12 and 13.

Similarly, the P2 terminal, N2 terminal, and U2 terminal in FIG. 15 respectively correspond to the positive external terminal 61A, negative external terminal 62A, and output external terminal 33A of the second semiconductor module 2B in FIG. 13. The G2 terminal and the S2a terminal in FIG. 15 respectively correspond to a control external terminal 34 and an auxiliary external terminal 35 of the second semiconductor module 2B as illustrated in FIG. 16. Moreover, the control external terminal 34 of the second semiconductor module 2B is electrically connected to each of the control terminals 7c of the third and second semiconductor units 1c and 1b illustrated in FIGS. 12 and 13. Furthermore, the auxiliary external terminal 35 of the second semiconductor module 2B is electrically connected to each of the auxiliary terminals 7d of the third and second semiconductor units 1c and 1b illustrated in FIGS. 12 and 13.

Figure 14A:
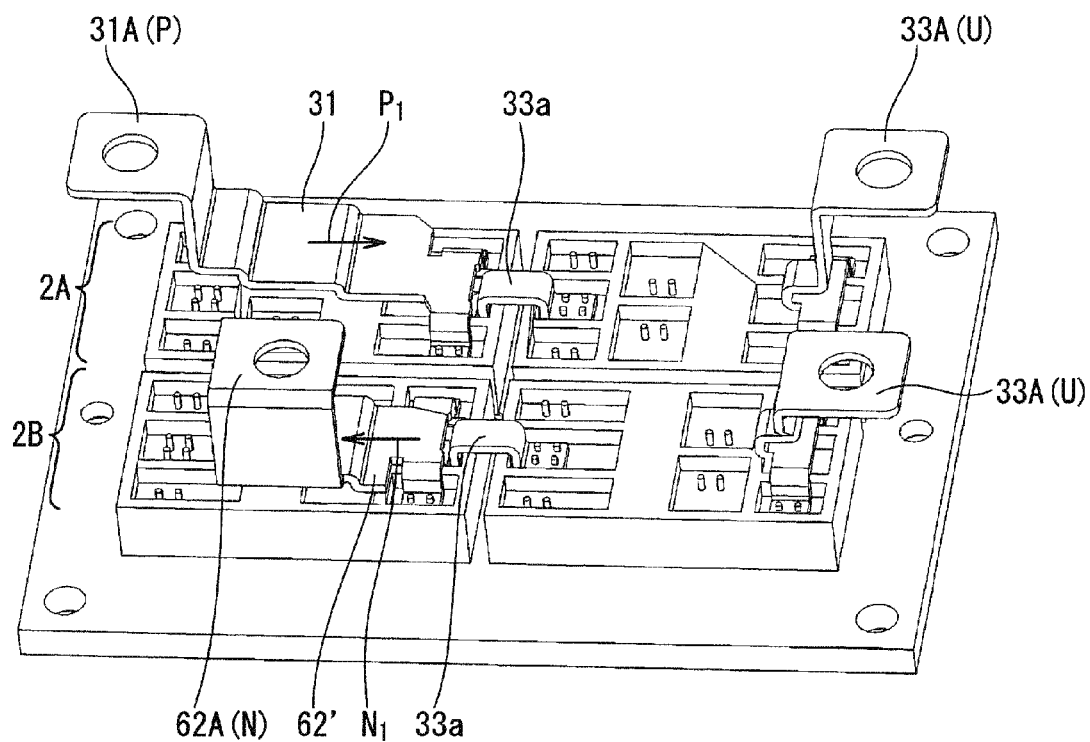
FIGS. 14A and 14B illustrates directions in which primary circuit current flows in the semiconductor device according to Embodiment 1 of the present invention (where FIG. 14A illustrates the directions in which primary circuit current flows through a positive connector of the first semiconductor module and a negative connector of the second semiconductor module, and FIG. 14B illustrates the directions in which primary circuit current flows through a negative connector of the first semiconductor module and a positive connector of the second semiconductor module).
Figure 14B:
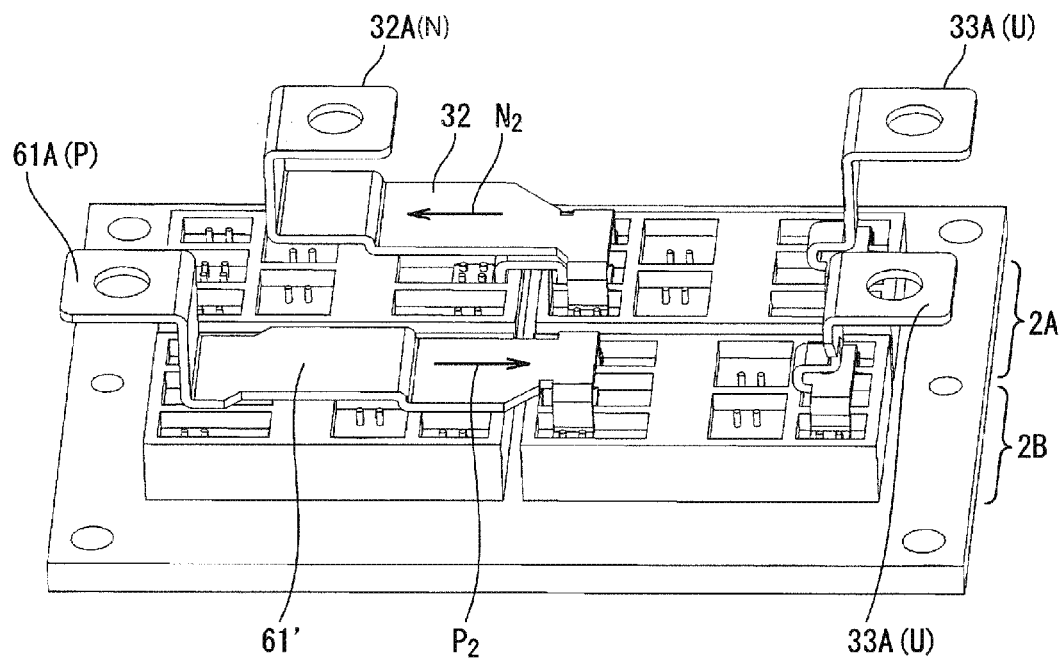

As illustrated in FIGS. 12 and 13, the semiconductor device 3A according to Embodiment 1 is laid out with the first semiconductor unit 1a (upper arm) of the first semiconductor module 2A and the third semiconductor unit 1c (lower arm) of the second semiconductor module 2B being adjacent to one another and the second semiconductor unit 1b (lower arm) of the first semiconductor module 2A and the fourth semiconductor unit 1d (upper arm) of the second semiconductor module 2B being adjacent to one another. Moreover, in the first semiconductor module 2A, the negative connector 32 and the positive connector 31 therebeneath are separated from and face one another. Meanwhile, in the second semiconductor module 2B, the positive connector 61' and the negative connector 62 therebeneath are separated from and face one another. Furthermore, as illustrated in FIG. 14A, the positive connector 31 of the first semiconductor module 2A and the negative connector 62' of the second semiconductor module 2B are adjacent to one another in the widthwise direction of the resin sealing bodies 9, and as illustrated in FIG. 14B, the negative connector 32 of the first semiconductor module 2A and the positive connector 61' of the second semiconductor module 2B are adjacent to one another in the widthwise direction (Y direction) of the resin sealing bodies 9. In addition, the direction in which primary circuit current flows through the positive connector 31 of the first semiconductor module 2A (the arrow $P_1$) and the direction in which primary circuit current flows through the negative connector 62' of the second semiconductor module 2B (the arrow $N_1$) are opposite to one another. Moreover, the direction in which primary circuit current flows through the negative connector 32 of the first semiconductor module 2A (the arrow $N_2$) and the direction in which primary circuit current flows through the positive connector 61' of the second semiconductor module 2B (the arrow $P_2$) are opposite to one another. Therefore, in the semiconductor device 3A according to Embodiment 1, increases in parasitic inductance between the first semiconductor module 2A and the second semiconductor module 2B can be canceled out.

As illustrated in FIG. 16, the semiconductor device 3A according to Embodiment 1 is housed within an outer case 37 made of a resin, for example, with the positive external terminals 31A (P) and 61A (P), the negative external terminals 32A (N) and 62A (N), the output external terminals 33A, the control external terminals 34, and the auxiliary external terminals 35 being exposed. The outer case 37 is supported by a support plate 36 having a plurality of mounting holes 36A. The first and second semiconductor modules 2A and 2B are fixed to the support plate 36 using fasteners 39 such as screws. Moreover, guides 38a and 38b for connector plates that extend between the positive external terminals 31A (P) and 61A (P) and between the negative external terminals 32A (N) and 62A (N) as well as a rib 38c for the connector plates are formed in an upper surface of the outer case 37. This makes it possible to easily connect connector plates such as conventional busbars to be electrically connected to the positive external terminals 31A (P) and 61A (P) and the negative external terminals 32A (N) and 62A (N). For example, a positive connector plate that is electrically connected to the positive external terminals 31A (P) and 61A (P) is arranged between the guide 38a and the rib 38c, and a negative connector plate that is electrically connected to the negative external terminals 32A (N) and 62A(N) is arranged between the guide 38b and the rib 38c. Using the guides 38a and 38b and the rib 38c illustrated in FIG. 16, the positive connector plate and the negative connector plate are arranged parallel to and facing one another. This makes it possible to reduce the mutual inductance between the positive connector plate and the negative connector plate.

As described above, in the semiconductor device 3A according to Embodiment 1, mutual inductance on the current paths between the first main circuit terminals 7a and the second main circuit terminals 7b can be reduced in the semiconductor units 1 (1a and 1b) of the first semiconductor module 2A and in the semiconductor units 1 (1c and 1d) of the second semiconductor module 2B.

Moreover, in the semiconductor device 3A according to Embodiment 1, the mutual inductance between the positive connectors 31 and 61' and the negative connectors 32 and 62' of the first and second semiconductor modules 2A and 2B can also be reduced.

Furthermore, in the semiconductor device 3A according to Embodiment 1, the mutual inductance between the connector plate that is electrically connected to the positive external terminals 31A (P) and 61A (P) of the first and second semiconductor modules 2A and 2B and the connector plate that is electrically connected to the negative external terminals 32A (N) and 62A (N) of the first and second semiconductor modules 2A and 2B can also be reduced.

In addition, in the semiconductor device 3A according to Embodiment 1, increases in mutual inductance between the first semiconductor module 2A and the second semiconductor module 2B can be canceled out.

Therefore, in the semiconductor device 3A according to Embodiment 1, the respective parasitic inductance of each current path going from the connector plate that is connected to the positive external terminals 31A (P) and 61A (P) to the connector plate that is connected to the negative external terminals 32A (N) and 62A (N) can be reduced, and increases in inductance between the semiconductor modules that are adjacent to one another can be canceled out. This makes it possible to reduce the overall parasitic inductance of the semiconductor device 3A according to Embodiment 1 and also makes it possible to suppress surge voltages applied during switching operation of the first and second semiconductor modules 2A and 2B.

Figure 17:
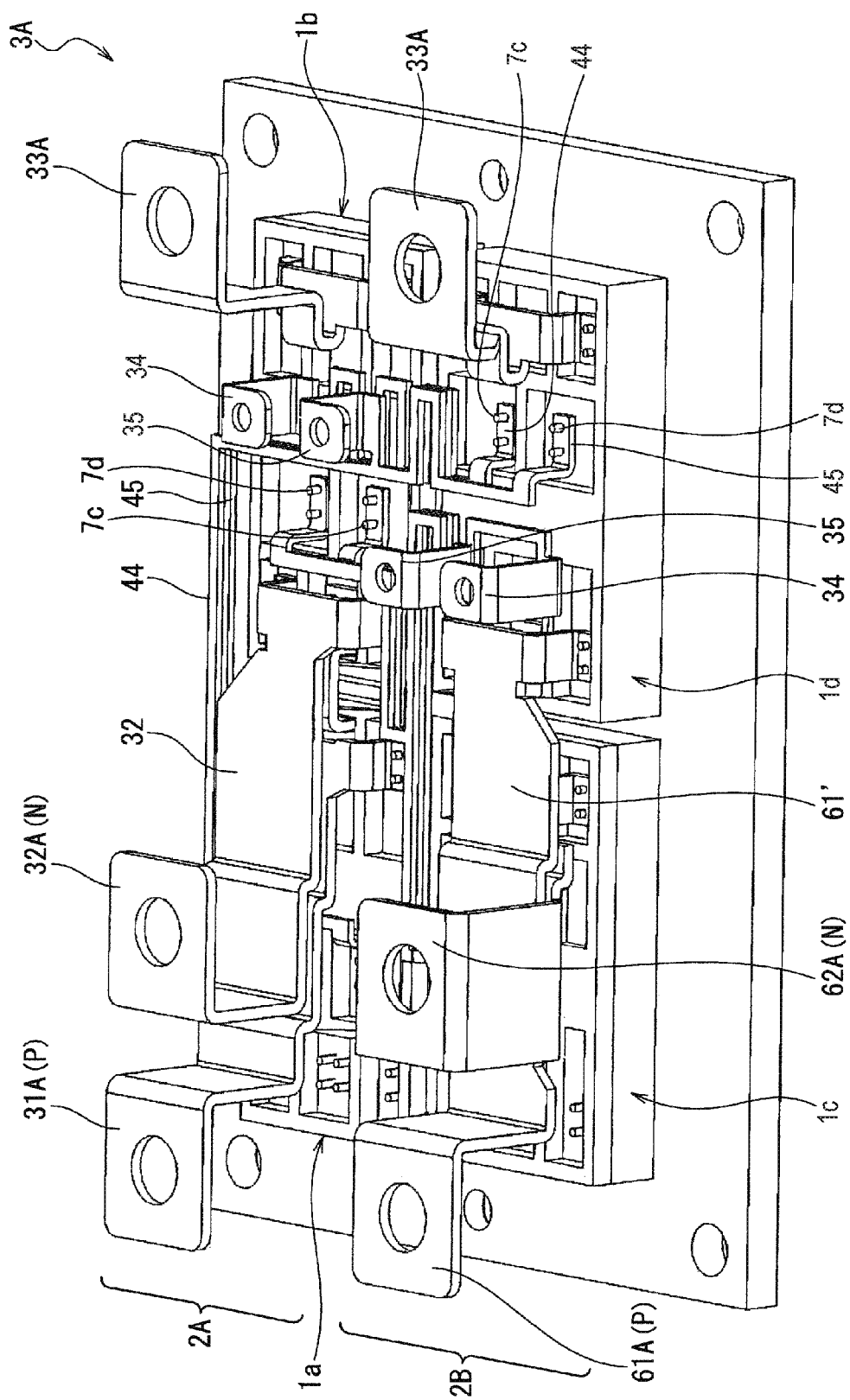
FIG. 17 is a perspective view schematically illustrating the example of the semiconductor device according to Embodiment 1 of the present invention.

As illustrated in FIG. 17, the control external terminal 34 of the first semiconductor module 2A is electrically connected to each of the control terminals 7c of the first and second semiconductor units 1a and 1b via control terminal connection wiring 44. Moreover, the auxiliary external terminal 35 of the first semiconductor module 2A is electrically connected to each of the auxiliary terminals 7d of the third and fourth semiconductor units 1c and 1d via auxiliary terminal connection wiring 45. In the first and second semiconductor units 1a and 1b, the control terminals 7c and the auxiliary terminals 7d are arranged between the first terminal array on the one short side 9a side and the second terminal array on the other short side 9b side of each resin sealing body 9. Moreover, the control terminal connection wiring 44 that electrically connects the control terminals 7c and control external terminal 34 and the auxiliary terminal connection wiring 45 that electrically connects the auxiliary terminals 7d and auxiliary external terminal 35 are drawn out so as to be separated from and face one another in the thickness direction (Z direction) of the resin sealing bodies 9. Therefore, in the first semiconductor module 2A, the wiring lengths of the control terminal connection wiring 44 and the auxiliary terminal connection wiring 45 can easily be made equal between the first semiconductor unit 1a (the upper arm) and the second semiconductor unit 1b (the lower arm), and the difference between the inductance between the control terminal connection wiring 44 and the auxiliary terminal connection wiring 45 in the upper arm as well as the inductance between the control terminal connection wiring 44 and the auxiliary terminal connection wiring 45 in the lower arm can be kept small.

Furthermore, in the second semiconductor module 2B, similar to in the first semiconductor module 2A, the third semiconductor unit 1c and the fourth semiconductor unit 1d have the same terminal arrangement as the first semiconductor unit 1a and the second semiconductor unit 1b, and control terminal connection wiring 44 that electrically connects the control terminals 7c and the control external terminal 34 as well as auxiliary terminal connection wiring 45 that electrically connects the auxiliary terminals 7d and the auxiliary external terminal 35 are drawn out so as to be separated from and face one another in the thickness direction (Z direction) of the resin sealing bodies 9. Therefore, in the semiconductor module 2B as well, the difference between the control terminal connection wiring 44-auxiliary terminal connection wiring 45 inductance in the upper arm and the control terminal connection wiring 44-auxiliary terminal connection wiring 45 inductance in the lower arm can also be kept small.

Figure 18:
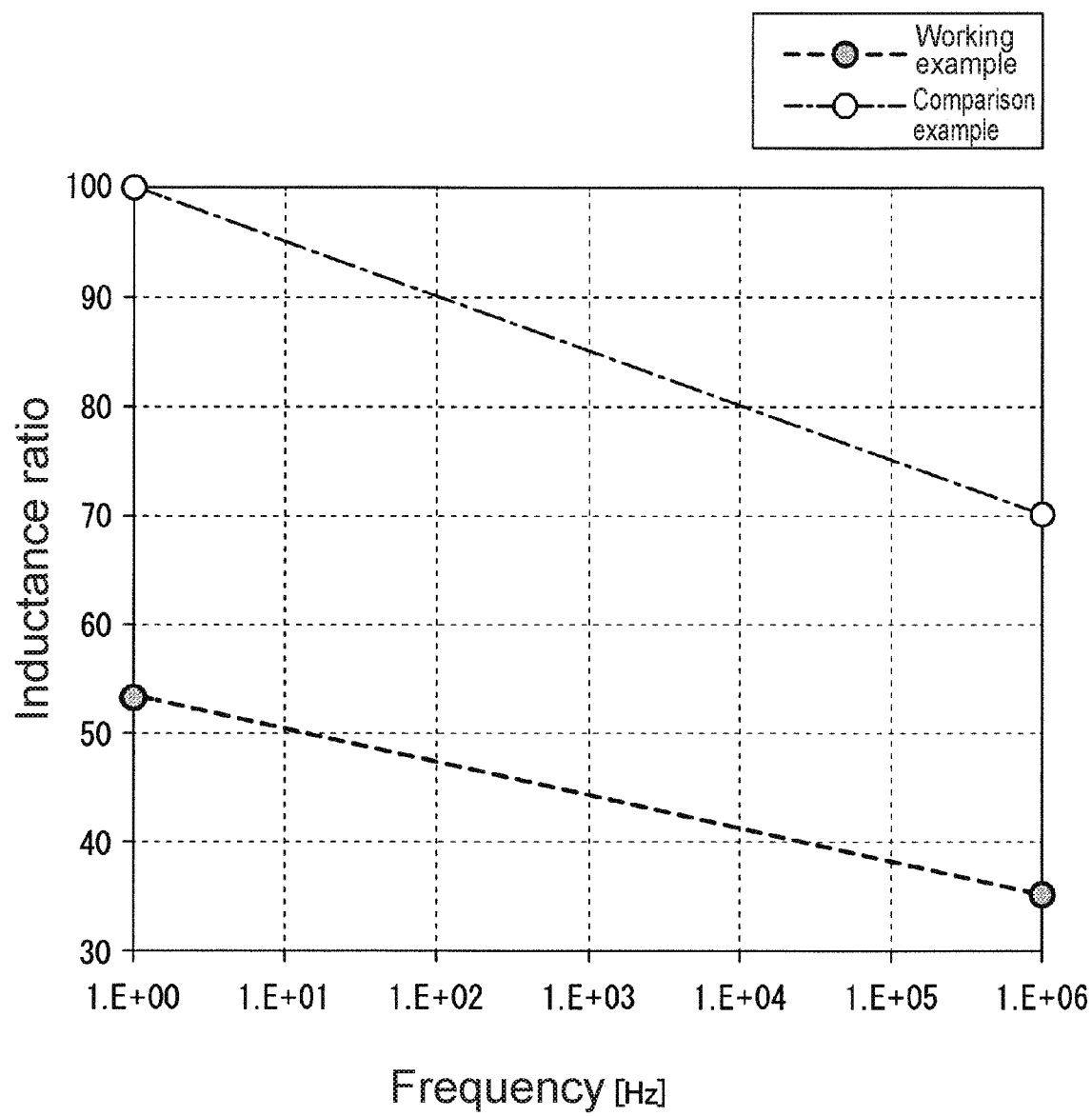
FIG. 18 shows an example of the results of evaluating the inductance of a semiconductor device according to a working example of the present invention.

FIG. 18 illustrates the results of using an impedance meter to measure impedance in the semiconductor device 3A according to Embodiment 1 as a working example and in a conventional semiconductor device as a comparison example. In FIG. 18, "Inductance ratio" is a ratio in which the inductance between the positive external terminals (P) and the negative external terminals (N) of the comparison example as measured at a frequency of 100 Hz is converted to a value of 100.

As illustrated in FIG. 18, in the working example the inductance between the positive external terminals (P) and the negative external terminals (N) was markedly smaller than in the comparison example.

This confirmed that the first and second semiconductor modules 2A and 2B as well as the semiconductor device 3A according to Embodiment 1 are effective in achieving reduced inductance.

Embodiment 2

Next, a semiconductor device 3B according to Embodiment 2 will be described with reference to FIG. 19. Note that in FIG. 19, components such as positive connectors 51 and 51', negative connectors 52 and 52', output connectors 53 and 53', and intermediate connectors 53a and 53a', which will be described below, are illustrated in a simplified manner.

Figure 19:
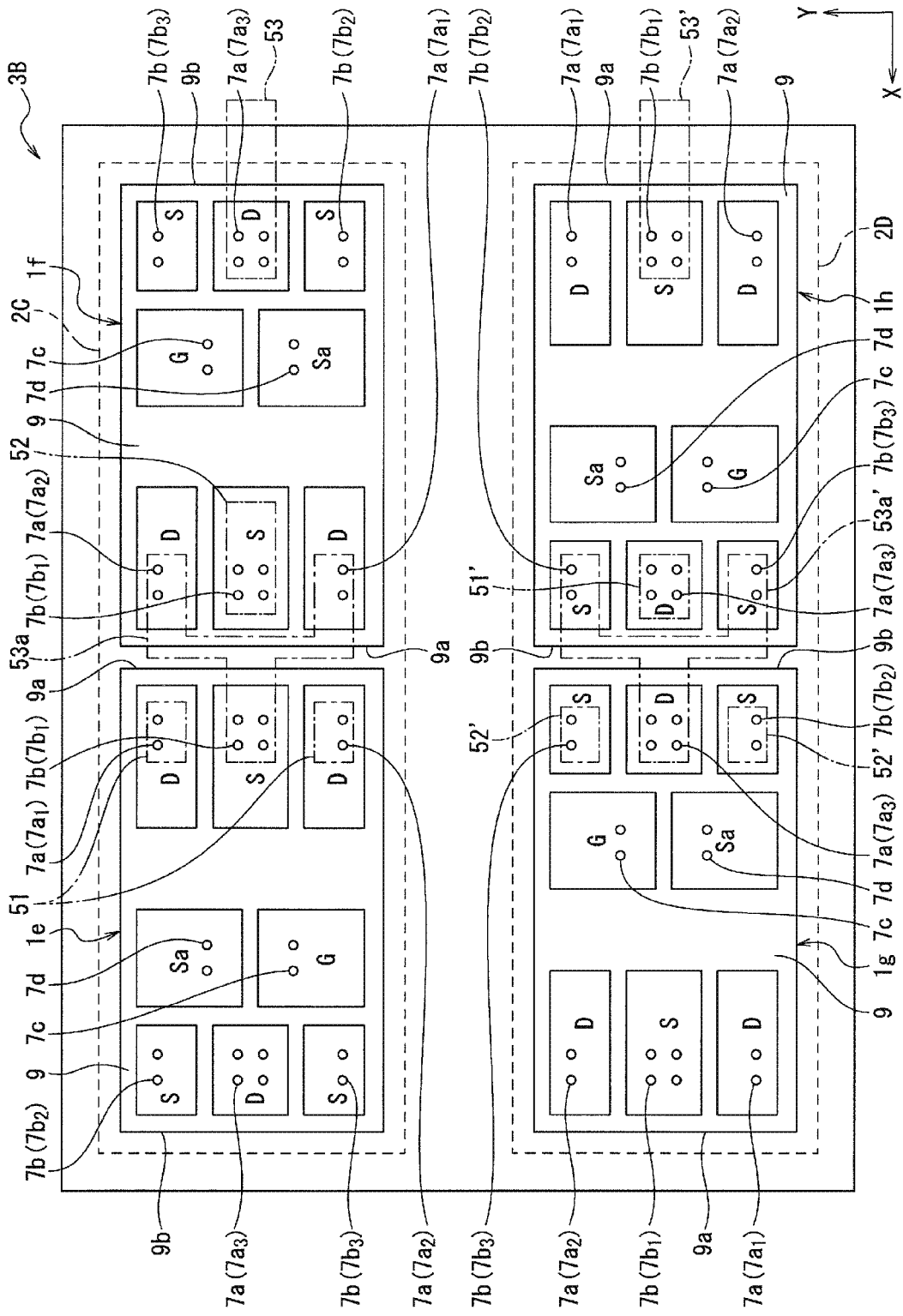
FIG. 19 is a plan view schematically illustrating an example of a semiconductor device according to Embodiment 2 of the present invention.

As illustrated in FIG. 19, the semiconductor device 3B according to Embodiment 2 includes a third semiconductor module 2C and a fourth semiconductor module 2D. Moreover, the third semiconductor module 2C is a two-in-one semiconductor module including semiconductor units 1 according to Embodiment 1 as a fifth semiconductor unit 1e and a sixth semiconductor unit 1f, and can be used as a half-wave rectifier circuit in which the fifth semiconductor unit 1e is an upper arm and the sixth semiconductor unit if is a lower arm. Furthermore, similar to the third semiconductor module 2C, the fourth semiconductor module 2D is a two-in-one semiconductor module including semiconductor units 1 according to Embodiment 1 as a seventh semiconductor unit 1g and an eighth semiconductor unit 1h, and can be used as a half-wave rectifier circuit in which the seventh semiconductor unit 1g is a lower arm and the eighth semiconductor unit 1h is an upper arm.

In the third semiconductor module 2C according to Embodiment 2, the fifth and sixth semiconductor units 1e and if are arranged with the one short side 9a side of the resin sealing body 9 of the fifth semiconductor unit 1e (the upper arm semiconductor unit) and the one short side 9a side of the resin sealing body 9 of the sixth semiconductor unit if (the lower arm semiconductor unit) facing one another. In other words, the third semiconductor module 2C according to Embodiment 2 has a unit arrangement in which the first terminal array (D-S-D) on the one short side 9a side of the fifth semiconductor unit 1e and the first terminal array (D-S-D) on the one short side 9a side of the sixth semiconductor unit if face one another.

Moreover, although this is not illustrated in detail, the third semiconductor module 2C includes a positive connector 51 which is electrically and mechanically connected on one end side to the first main circuit terminals $7a$ ($7a_1$ and $7a_2$) of the first terminal array (on the one short side 9a side) of the fifth semiconductor unit 1e and has a positive external terminal (P) on the other end side.

The third semiconductor module 2C further includes a negative connector 52 which is electrically and mechanically connected on one end side to the second main circuit terminals $7b$ ($7b_1$) of the first terminal array (on the one short side 9a side) of the sixth semiconductor unit if and has a negative external terminal (N) on the other end side.

In addition, the third semiconductor module 2C includes an output connector 53 which is electrically and mechanically connected on one end side to the first main circuit terminals $7a$ ($7a_3$) of the second terminal array (on the other short side 9b side) of the sixth semiconductor unit if and has an output external terminal (U) on the other end side.

The third semiconductor module 2C further includes an intermediate connector 53a which is electrically and mechanically connected on one end side to the second main circuit terminals $7b_1$ of the first terminal array (on the one short side 9a side) of the fifth semiconductor unit 1e and is electrically and mechanically connected on the other end side to the first main circuit terminals $7a$ ($7a_1$ and $7a_2$) of the first terminal array (on the one short side 9a side) of the sixth semiconductor unit 1f.

Similar to the positive connector 31 in Embodiment 1, the positive connector 51 extends, parallel to the upper surface of the fifth semiconductor unit 1e, from the first terminal array side (one short side 9a side) towards the second terminal array side (other 9b side) of the fifth semiconductor unit 1e.

Similar to the negative connector 32 in Embodiment 1, the negative connector 52 is arranged near and parallel to the positive connector 51 and extends towards the second terminal array side (other side 9b side) of the fifth semiconductor unit 1e.

Similar to the output connector 33 in Embodiment 1, the output connector 53 extends in the vertical direction (Z direction) from the resin sealing body 9 on the second terminal array side (other side 9b side) of the sixth semiconductor unit 1f.

In the fourth semiconductor module 2D according to Embodiment 2, the seventh and eighth semiconductor units 1g and 1h are arranged with the other short side 9b side of the resin sealing body 9 of the seventh semiconductor unit 1g (the lower arm semiconductor unit) and the other short side 9b side of the resin sealing body 9 of the eighth semiconductor unit 1h (the upper arm semiconductor unit) facing one another. In other words, the fourth semiconductor module 2D according to Embodiment 2 has a unit arrangement in which the second terminal array (S-D-S) on the other short side 9b side of the seventh semiconductor unit 1g and the second terminal array (S-D-S) on the other short side 9b side of the eighth semiconductor unit 1h face one another.

Moreover, although this is not illustrated in detail, the fourth semiconductor module 2D includes a positive connector 51' which is connected on one end side to the first main circuit terminals $7a_3$ of the second terminal array (on the other short side 9b side) of the eighth semiconductor unit 1h and has a positive external terminal (P) on the other end side.

The fourth semiconductor module 2D further includes a negative connector 52' which is connected on one end side to the second main circuit terminals $7b_2$ and $7b_3$ of the second terminal array of the seventh semiconductor unit 1g and has a negative external terminal (N) on the other end side.

Furthermore, the fourth semiconductor module 2D includes an output connector 53' which is connected on one end side to the second main circuit terminals $7b_1$ of the first terminal array (on the short side 9a side) of the eighth semiconductor unit 1h and has an output external terminal (U) on the other end side.

The fourth semiconductor module 2D further includes an intermediate connector 53a' which is electrically connected to the first main circuit terminals $7a_3$ of the second terminal array (on the short side 9b side) of the seventh semiconductor unit 1g and to the second main circuit terminals $7b_2$ and $7b_3$ of the second terminal array (on the short side 9b side) of the eighth semiconductor unit 1h.

The positive connector 51' extends, parallel to the upper surface of the seventh semiconductor unit 1g, from the second terminal array side (other short side 9b side) of the eighth semiconductor unit 1h towards the first terminal array side (one short side 9a side) of the seventh semiconductor unit 1g.

The negative connector 52' is arranged near and parallel to the positive connector 51' and extends towards the first terminal array side (one short side 9a side) of the seventh semiconductor unit 1g.

The output connector 53' extends in the vertical direction (Z direction) from the resin sealing body 9 on the first terminal array side (one short side 9a side) of the eighth semiconductor unit 1h.

Near the one short side 9a of the seventh semiconductor unit 1g, the positive external terminal and the negative external terminal are arranged near one another and above or near the seventh semiconductor unit 1g. This makes it possible to shorten the positive connector 51', the negative connector 52', and the output connector 53'.

The positive connector 51' and the negative connector 52' are arranged with the primary surfaces of each separated from and facing one another, and the primary surfaces of each are arranged parallel to the upper surface of the seventh semiconductor unit 1g (the upper surface of the resin sealing body 9). Thus, in this embodiment, the arrangement of the respective external terminals and the various connectors is the same as that shown in FIG. 13 except for parts connecting to various corresponding main circuit terminals.

The semiconductor device 3B according to Embodiment 2 can be represented by the same equivalent circuit as the semiconductor device 3A according to Embodiment 1. In other words, referring to FIG. 15, the P1 terminal, N1 terminal, and U1 terminal in FIG. 15 respectively correspond to the positive external terminal, negative external terminal, and output external terminal of the third semiconductor module 2C in FIG. 19. The G1 terminal and the S1a terminal in FIG. 15 respectively correspond to a control external terminal and an auxiliary external terminal of the third semiconductor module 2C illustrated in FIG. 19. Moreover, the control external terminal of the third semiconductor module 2C is electrically connected to each of the control terminals 7c of the fifth and sixth semiconductor units 1e and if of the third semiconductor module 2C. Furthermore, the auxiliary external terminal of the third semiconductor module 2C is electrically connected to each of the auxiliary terminals 7d of the fifth and sixth semiconductor units 1e and if of the third semiconductor module 2C.

Similarly, the P2 terminal, N2 terminal, and U2 terminal in FIG. 15 respectively correspond to the positive external terminal, negative external terminal, and output external terminal of the fourth semiconductor module 2D in FIG. 19. The G2 terminal and the S2a terminal in FIG. 15 respectively correspond to a control external terminal and an auxiliary external terminal of the fourth semiconductor module 2D illustrated in FIG. 19. Moreover, the control external terminal of the fourth semiconductor module 2D is electrically connected to each of the control terminals 7c of the seventh and eighth semiconductor units 1g and 1h of the fourth semiconductor module 2D. Furthermore, the auxiliary external terminal of the fourth semiconductor module 2D is electrically connected to each of the auxiliary terminals 7d of the seventh and eighth semiconductor units 1g and 1h of the fourth semiconductor module 2D.

The semiconductor device 3B according to Embodiment 2 is laid out with the fifth semiconductor unit 1e (upper arm) of the first semiconductor module 2C and the seventh semiconductor unit 1g (lower arm) of the fourth semiconductor module 2D being adjacent to one another and the sixth semiconductor unit if (lower arm) of the third semiconductor module 2C and the eighth semiconductor unit 1h (upper arm) of the fourth semiconductor module 2D being adjacent to one another. Moreover, in the third semiconductor module 2C, the negative connector and the positive connector therebeneath are separated from and face one another. Meanwhile, in the fourth semiconductor module 2D, the positive connector and the negative connector therebeneath are separated from and face one another. Furthermore, the positive connector of the third semiconductor module 2C and the negative connector of the fourth semiconductor module 2D are adjacent to one another in the widthwise direction of the resin sealing bodies 9, and the negative connector of the third semiconductor module 2C and the positive connector of the fourth semiconductor module 2D are adjacent to one another in the widthwise direction (Y direction) of the resin sealing bodies 9. In addition, the direction in which primary circuit current flows through the positive connector of the third semiconductor module 2C (the arrow $P_1$ in FIGS. 14A and 14B) and the direction in which primary circuit current flows through the negative connector of the fourth semiconductor module 2D (the arrow $N_1$ in FIGS. 14A and 14B) are opposite to one another. Similarly, the direction in which primary circuit current flows through the negative connector of the third semiconductor module 2C (the arrow $N_2$ in FIGS. 14A and 14B) and the direction in which primary circuit current flows through the positive connector of the fourth semiconductor module 2D (the arrow $P_2$ in FIGS. 14A and 14B) are opposite to one another. Therefore, in the semiconductor device 3B according to Embodiment 2, increases in parasitic inductance between the third semiconductor module 2C and the fourth semiconductor module 2D can be canceled out.

Similar to the semiconductor device 3A illustrated in FIG. 16, the semiconductor device 3B according to Embodiment 2 is housed within an outer case made of a resin, for example, with the positive external terminals, negative external terminals, output external terminals, control external terminals, and auxiliary external terminals being exposed. The outer case is supported by a support plate having a plurality of mounting holes. The third and fourth semiconductor modules 2C and 2D are fixed to the support plate using fasteners such as screws. Moreover, in an upper surface of the outer case, guides for connector plates that extend between the positive external terminal of the third semiconductor module 2C and the positive external terminal of the fourth semiconductor module 2D and between the negative external terminal of the third semiconductor module 2C and the negative external terminal of the fourth semiconductor module 2D as well as a rib for the connector plates are formed similar to in the semiconductor device 3A according to Embodiment 1. This makes it possible to easily connect connector plates such as conventional busbars to be respectively electrically connected to the positive external terminals and the negative external terminals. For example, a positive connector plate that is electrically connected to the positive external terminals is arranged between one guide and the rib, and a positive connector plate that is electrically connected to the negative external terminals is arranged between one guide and the rib. Using the guides and the rib, the positive connector plate and the negative connector plate are arranged parallel to and facing one another similar to in the semiconductor device 3A illustrated in FIG. 16. This makes it possible to reduce the mutual inductance between the positive connector plate and the negative connector plate.

In the third and fourth semiconductor modules 2C and 2D according to Embodiment 2, semiconductor units 1 according to Embodiment 1 are used to construct half-wave rectifier circuits. Moreover, the semiconductor device 3B according to Embodiment 2 is constructed using the third and fourth semiconductor modules 2C and 2D. Therefore, the third and fourth semiconductor modules 2C and 2D according to Embodiment 2 achieve the same advantageous effects as the first and second semiconductor modules 2A and 2B according to Embodiment 1. Moreover, the semiconductor device 3B according to Embodiment 2 achieves the same advantageous effects as the semiconductor device 3A according to Embodiment 1.

As described above, the embodiments of the present invention make it possible to provide semiconductor units 1 that offer high ease of use. Moreover, these embodiments make it possible to provide semiconductor modules and semiconductor devices in which the overall parasitic inductance can be reduced.

Upon understanding the key points of the above disclosure of embodiments, it would be apparent to a person skilled in the art that various alternative embodiments, working examples, and applied technologies could be included within the present invention. Moreover, the present invention includes various other embodiments and the like that are not explicitly described here, such as configurations achieved by freely applying aspects of the embodiments and modification examples described above. Accordingly, the technical scope of the present invention is defined only by the characterizing features of the invention as set forth in the claims, which are appropriately derived from the exemplary descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor unit, comprising:
   one or plurality of transistor chips each having a first main electrode and a second main electrode;
   first main circuit terminals that are electrically connected to the first main electrode of each of said one or plurality of the transistor chips;
   second main circuit terminals that are electrically connected to the second main electrode of each of said one or plurality of the transistor chips; and
   a sealing body having a generally rectangular shape with two sides respectively defining two sides of the semiconductor unit opposing to each other in a first direction in a plan view, the sealing body sealing said one or plurality of the transistor chips and the first and second main circuit terminals except for respective distal portions of the first and second main circuit terminals that are exposed from the sealing body,
   wherein the first main circuit terminals are arranged in both corners of one side, among said two sides, of the semiconductor unit, and in a center of another side, among said two sides, of the semiconductor unit in the plan view, and
   wherein the second main circuit terminals are arranged in a center of said one side of the semiconductor unit and in both corners of said another side of the semiconductor unit in the plan view.

2. The semiconductor unit according to claim 1,
   wherein the transistor chips are provided in a plurality, each of transistor chips has the first main electrode on a bottom surface and the second main electrode on a top surface, and
   wherein the semiconductor unit further comprises:
   an insulating board;
   a first conductor layer on the insulating board, the first conductor layer having the plurality of transistor chips mounted thereon so that the first conductor layer is electrically connected to the first main electrode of each of the plurality of transistor chips, the first conductor layer having, in the plan view, corner portions protruding laterally and outwardly in the first direction adjacent to said corners of said one side and further having a center portion protruding laterally and outwardly in a direction opposite to the first direction adjacent to said center of said another side;
   a second conductor layer on the insulating board, arranged between the corner portions of the first conductor layer adjacent to said one side;
   a pair of third conductor layers on the insulating board, respectively arranged on both sides of the center portion of the first conductor layer so as to be positioned on either side of the center portion adjacent to said another side; and
   a wiring substrate disposed above, and in parallel with, the insulating board having the first, second, and the third conductor layers thereon, the wiring substrate including a wiring layer that is electrically connected to the second main electrodes of the plurality of transistor chips and to the second and third conductor layers,
   wherein the first main circuit terminals are disposed on, and vertically extending from, the corner portions and the center portion of the first conductor layer so as to be arranged in said both corners of said one side and in the center of said another side and so as to be electrically connected to the first main electrode of each of the plurality of transistor chips via the first conductor layer,
   wherein the second main circuit terminals are disposed on, and vertically extending from, the second conductor layer and the third conductor layers so as to be arranged in the center of said one side and in said both corners of said another side and so as to be electrically connected to the second main electrode of each of the transistor chips via the second or third conductor layer and the wiring layer, and
   wherein the sealing body encloses and seals the insulating board having the first, second, and the third conductor layers thereon and the wiring substrate except for the respective distal portions of the first and second main circuit terminals that are exposed from the sealing body.

3. The semiconductor unit according to claim 2, wherein the plurality of transistor chips are arranged on the first conductor layer in a plurality of rows running in the first direction.

4. The semiconductor unit according to claim 3, wherein the second conductor layer and the third conductor layers are positioned on or adjacent to virtual lines along which the respective rows of the plurality of transistor chips extend.

5. The semiconductor unit according to claim 2, further comprising:
   first conductive posts that connect the second main electrodes of the plurality of transistor chips to the wiring layer in the wiring substrate;
   second conductive posts that connect the wiring layer to the second conductor layer; and
   third conductive posts that connect the wiring layer to the third conductor layers.

6. The semiconductor unit according to claim 3, further comprising a plurality of diode chips that are arranged on the first conductor layer in a row or rows between said rows of transistor chips and that are electrically connected in anti-parallel to the transistor chips.

7. A semiconductor module, comprising:
   two of the semiconductor unit as set forth in claim 1 as an upper arm semiconductor unit for an upper arm of a half-bridge circuit and a lower arm semiconductor unit for a lower arm of the half-bridge circuit, the upper and lower semiconductor units being arranged side-by-side with said one side of the upper arm semiconductor unit and said another side of the lower semiconductor unit facing each other;
   a positive external terminal having a positive connector extending from the positive external terminal, an end of the positive connector being directly connected to the first main circuit terminals arranged in said both corners of said one side of the upper arm semiconductor unit and being not directly connected to the first main circuit terminals arranged in said center of said another side of the upper arm semiconductor unit;
   a negative external terminal having a negative connector extending from the negative external terminal, an end of the negative connector being directly connected to the second main circuit terminals arranged in said both corners of said another side of the lower arm semiconductor unit, and being not directly connected to the second main circuit terminals arranged in said center of said one side of the lower arm semiconductor unit;
   an output external terminal having an output connector extending from the output external terminal, an end of the output connector being directly connected to either the first main circuit terminals arranged in said both corners of said one side of the lower arm semiconductor unit, or the second main circuit terminals arranged in said both corners of said another side of the upper arm semiconductor unit; and
   an intermediate connector that is connected to the second main circuit terminals arranged in said center of said one side of the upper arm semiconductor unit and to the first main circuit terminals arranged in said center of said another side of the lower arm semiconductor unit.

8. The semiconductor module according to claim 7, wherein said end of the output connector is directly connected to the first main circuit terminals arranged in said both corners of said one side of the lower arm semiconductor unit, and the output external terminal is arranged above the lower arm semiconductor unit adjacent to said one side of the upper arm semiconductor unit, and
   wherein the positive external terminal and the negative external terminal are arranged side-by-side above the upper arm semiconductor unit adjacent to said another side of the upper arm semiconductor unit.

9. The semiconductor module according to claim 7,
   wherein said end of the output connector is directly connected to the second main circuit terminals arranged in said both corners of said another side of the upper arm semiconductor unit, and the output external terminal is arranged above the lower arm semiconductor unit adjacent to said another of the upper arm semiconductor unit, and
   wherein the positive external terminal and the negative external terminal are arranged side-by-side above the lower arm semiconductor unit adjacent to said one side of the lower arm semiconductor unit.

10. A semiconductor module, comprising:
    two of the semiconductor unit as set forth in claim 1 as an upper arm semiconductor unit for an upper arm of a half-bridge circuit and a lower arm semiconductor unit for a lower arm of the half-bridge circuit, the upper and lower arm semiconductor units being arranged side-by-side with said one side of the upper arm semiconductor unit and said one side of the lower arm semiconductor unit facing each other;
    a positive external terminal having a positive connector extending from the positive external terminal, an end of the positive connector being directly connected to the first main circuit terminals arranged in said both corners of said one side of the upper arm semiconductor unit and being not directly connected to the first main circuit terminals arranged in said center of said another side of the upper arm semiconductor unit;
    a negative external terminal having a negative connector extending from the negative external terminal, an end of the negative connector being directly connected to the second main circuit terminals arranged in said center of said one side of the lower arm semiconductor unit, and being not directly connected to the second main circuit terminals arranged in said both corners of said another side of the lower arm semiconductor unit;
    an output external terminal having an output connector extending from the output external terminal, an end of the output connector being directly connected to the first main circuit terminals arranged in said center of said another side of the lower arm semiconductor unit; and
    an intermediate connector that is connected to the second main circuit terminals arranged in said center of said one side of the upper arm semiconductor unit and to the first main circuit terminals arranged in said both corners of said one side of the lower arm semiconductor unit.

11. The semiconductor module according to claim 10,
    wherein the output external terminal is arranged above the lower arm semiconductor unit adjacent to said another side of the upper arm semiconductor unit, and
    wherein the positive external terminal and the negative external terminal are arranged side-by-side above the upper arm semiconductor unit adjacent to said another side of the upper arm semiconductor unit.

12. A semiconductor module, comprising:
    two of the semiconductor unit as set forth in claim 1 as an upper arm semiconductor unit for an upper arm of a half-bridge circuit and a lower arm semiconductor unit for a lower arm of the half-bridge circuit, the upper and lower arm semiconductor units being arranged side-by-side with said another side of the upper arm semiconductor unit and said another side of the lower arm semiconductor unit facing each other;

a positive external terminal having a positive connector extending from the positive external terminal, an end of the positive connector being directly connected to the first main circuit terminals arranged in said center of said another side of the upper arm semiconductor unit and being not directly connected to the first main circuit terminals arranged in said both corners of said one side of the upper arm semiconductor unit;

a negative external terminal having a negative connector extending from the negative external terminal, an end of the negative connector being directly connected to the second main circuit terminals arranged in said both corners of said another side of the lower arm semiconductor unit, and being not directly connected to the second main circuit terminals arranged in said center of said one side of the lower arm semiconductor unit;

an output external terminal having an output connector extending from the output external terminal, an end of the output connector being directly connected to the second main circuit terminals arranged in said center of said one side of the upper arm semiconductor unit; and an intermediate connector that is connected to the second main circuit terminals arranged in said both corners of said another side of the upper arm semiconductor unit and to the first main circuit terminals arranged in said center of said another side of the lower arm semiconductor unit.

13. The semiconductor module according to claim 12, wherein the positive external terminal and the negative external terminal are arranged side-by-side above the lower arm semiconductor unit adjacent to said one side of the lower arm semiconductor unit, and wherein the output external terminal is arranged above the upper arm semiconductor unit adjacent to said one side of the upper arm semiconductor unit.

14. A semiconductor device comprising:
two of the semiconductor module as set forth in claim 7 as a first semiconductor module and a second semiconductor module, wherein in the first semiconductor module, said end of the output connector is directly connected to the first main circuit terminals arranged in said both corners of said one side of the lower arm semiconductor unit, wherein in the second semiconductor module, said end of the output connector is directly connected to the second main circuit terminals arranged in said both corners of said another side of the upper arm semiconductor unit, and wherein the first semiconductor module and the second semiconductor module are arranged side-by-side with each other with the upper arm semiconductor unit of the first semiconductor module and the lower arm semiconductor unit of the second semiconductor module being arranged side-by-side and adjacent to each other and with the lower arm semiconductor unit of the first semiconductor module and the upper arm semiconductor unit of the second semiconductor module being arranged side-by-side and adjacent to each other.

15. A semiconductor device comprising:
the semiconductor module as set forth in claim 8 as a first semiconductor module; and
the semiconductor module as set forth in claim 9 as a second semiconductor module,
wherein the first semiconductor module and the second semiconductor module are arranged side-by-side with each other with the upper arm semiconductor unit of the first semiconductor module and the lower arm semiconductor unit of the second semiconductor module being arranged side-by-side and adjacent to each other and with the lower arm semiconductor unit of the first semiconductor module and the upper arm semiconductor unit of the second semiconductor module being arranged side-by-side and adjacent to each other.

16. A semiconductor device comprising:
the semiconductor module as set forth in claim 10 as a first semiconductor module; and
the semiconductor module as set forth in claim 12 as a second semiconductor module,
wherein the first semiconductor module and the second semiconductor module are arranged side-by-side with each other with the upper arm semiconductor unit of the first semiconductor module and the lower arm semiconductor unit of the second semiconductor module being arranged side-by-side and adjacent to each other and with the lower arm semiconductor unit of the first semiconductor module and the upper arm semiconductor unit of the second semiconductor module being arranged side-by-side and adjacent to each other.

17. A semiconductor device comprising:
the semiconductor module as set forth in claim 11 as a first semiconductor module; and
the semiconductor module as set forth in claim 13 as a second semiconductor module,
wherein the first semiconductor module and the second semiconductor module are arranged side-by-side with each other with the upper arm semiconductor unit of the first semiconductor module and the lower arm semiconductor unit of the second semiconductor module being arranged side-by-side and adjacent to each other and with the lower arm semiconductor unit of the first semiconductor module and the upper arm semiconductor unit of the second semiconductor module being arranged side-by-side and adjacent to each other.

18. The semiconductor module according to claim 7, wherein the positive connector and the negative connector respectively have horizontally extending portions facing each other above the upper arm semiconductor unit or the lower arm semiconductor unit.

19. The semiconductor module according to claim 10, wherein the positive connector and the negative connector respectively have horizontally extending portions facing each other above the upper arm semiconductor unit or the lower arm semiconductor unit.

20. The semiconductor module according to claim 12, wherein the positive connector and the negative connector respectively have horizontally extending portions facing each other above the upper arm semiconductor unit or the lower arm semiconductor unit.

* * * * *